(12) United States Patent
Nealey et al.

(10) Patent No.: US 8,618,221 B2
(45) Date of Patent: Dec. 31, 2013

(54) DIRECTED ASSEMBLY OF TRIBLOCK COPOLYMERS

(75) Inventors: Paul Franklin Nealey, Madison, WI (US); Frank S. Bates, St. Louis Pk, MN (US); Juan J. de Pablo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 944 days.

(21) Appl. No.: 11/580,694

(22) Filed: Oct. 12, 2006

(65) Prior Publication Data
US 2009/0087664 A1    Apr. 2, 2009

Related U.S. Application Data

(60) Provisional application No. 60/726,766, filed on Oct. 14, 2005.

(51) Int. Cl.
*C08F 293/00* (2006.01)
(52) U.S. Cl.
USPC ............... 525/280; 525/88; 525/89; 525/941
(58) Field of Classification Search
USPC ......... 439/276; 525/89, 71; 524/505; 528/73; 428/195.1, 411; 427/198, 558
See application file for complete search history.

(56) References Cited

U.S. PATENT DOCUMENTS

| | | | |
|---|---|---|---|
| 3,444,732 A | 5/1969 | McKinley et al. | |
| 4,235,657 A | 11/1980 | Greenman et al. | |
| 5,948,470 A * | 9/1999 | Harrison et al. | 427/198 |
| 6,146,755 A | 11/2000 | Guha et al. | |
| 6,565,763 B1 * | 5/2003 | Asakawa et al. | 216/56 |
| 6,746,825 B2 | 6/2004 | Nealey et al. | |
| 6,893,705 B2 | 5/2005 | Thomas | |
| 6,926,953 B2 | 8/2005 | Nealey et al. | |
| 7,704,432 B2 | 4/2010 | Dumond et al. | |
| 7,901,607 B2 | 3/2011 | Xu et al. | |
| 7,959,975 B2 | 6/2011 | Millward | |
| 8,133,341 B2 | 3/2012 | Nealey et al. | |

(Continued)

FOREIGN PATENT DOCUMENTS

| | | |
|---|---|---|
| JP | 10-330494 | 12/1998 |
| JP | 2004-087531 | 3/2004 |

(Continued)

OTHER PUBLICATIONS

Enabling nanotechnology with self assembled block copolymer patterns. Park et al. Polymer, vol. 44 (2003). pp. 6725-6760.*

(Continued)

*Primary Examiner* — D. Lawrence Tarazano
*Assistant Examiner* — Klee S Simmons
(74) *Attorney, Agent, or Firm* — Weaver Austin Villeneueve & Sampson LLP

(57) ABSTRACT

Methods of directed self-assembly of multi-block (i.e., triblock and higher-order) copolymers on patterned substrates and related compositions are provided. According to various embodiments, the methods involve depositing copolymer materials on substrates configured to drive the assembly of micro-phase separated films that exhibit the same morphology as that copolymer materials in the bulk. In certain embodiments, binary patterns are used to drive the triblock copolymer films. The binary two-dimensional surface patterns are transformed into three-component and three-dimensional structures throughout the thickness of the overlying copolymer films.

10 Claims, 16 Drawing Sheets

(56) References Cited

U.S. PATENT DOCUMENTS

| | | | |
|---|---|---|---|
| 8,133,534 B2 | 3/2012 | Nealey et al. | |
| 8,168,284 B2 | 5/2012 | Nealey et al. | |
| 8,287,957 B2 | 10/2012 | Nealey et al. | |
| 2003/0091752 A1* | 5/2003 | Nealey et al. | 427/558 |
| 2003/0091865 A1 | 5/2003 | Chen et al. | |
| 2004/0143063 A1 | 7/2004 | Chen et al. | |
| 2004/0174257 A1 | 9/2004 | Kuhns et al. | |
| 2006/0134556 A1 | 6/2006 | Nealey et al. | |
| 2007/0092721 A1 | 4/2007 | Kishimoto | |
| 2007/0095469 A1 | 5/2007 | Burdinski | |
| 2008/0075978 A1 | 3/2008 | Weller et al. | |
| 2008/0257187 A1 | 10/2008 | Millward | |
| 2008/0299353 A1 | 12/2008 | Stoykovich et al. | |
| 2009/0087653 A1 | 4/2009 | Nealey et al. | |
| 2009/0087664 A1 | 4/2009 | Nealey et al. | |
| 2009/0196488 A1 | 8/2009 | Nealey et al. | |
| 2009/0260750 A1 | 10/2009 | Nealey et al. | |
| 2010/0255268 A1 | 10/2010 | Choi et al. | |
| 2012/0164392 A1 | 6/2012 | Stoykovich et al. | |
| 2012/0189824 A1 | 7/2012 | Nealey et al. | |
| 2012/0202017 A1 | 8/2012 | Nealey et al. | |

FOREIGN PATENT DOCUMENTS

| | | |
|---|---|---|
| JP | 2004/099667 | 4/2004 |
| JP | 2005-502916 | 1/2005 |
| JP | 2005-502917 | 1/2005 |
| JP | 2007125699 | 5/2007 |
| JP | 2007/138052 | 6/2007 |
| JP | 2007/313568 | 12/2007 |
| JP | 2011-080379 | 4/2011 |
| WO | 03/023517 | 3/2003 |
| WO | WO2006112887 | 6/2006 |
| WO | 2007/111215 A | 10/2007 |
| WO | 2009/146086 | 3/2010 |

OTHER PUBLICATIONS

U.S. Appl. No. 11/645,060, filed Oct. 5, 2006, Nealey et al.
U.S. Appl. No. 11/879,758, filed Feb. 17, 2007, Nealey et al.
International Search Report dated May 2, 2007 issued in WO2006112887.
Written Opinion dated May 2, 2007 issued in WO2006112887.
Preliminary Examination Report dated May 30, 2007 issued in WO2006112887.
Asakawa et al. (2002) Nanopatterning with Microdomains of Block Copolymers using Reactive-Ion Etching Selectivity, *Jpn. J. Appl. Phys.*vol. 41 (2002) pp. 6112-6118.
Bates et al. (1990) Block Copolymer Thermodynamics: Theory and Experiment, *Annu.Rev.Phys. Chem.*, 1990, 41: pp. 525-557.
Bates et al. (1997) Polymeric Bicontinuous Microemulsions, *Phy Rev Ltrs*, vol. 69, No. 5, Aug. 4, 1997.
Bates et al. (1995) Isotropic Lifshitz Behavior in Block Copolymer-Homopolymer Blends, *Phy Rev Ltrs*, vol. 75, No. 24, Dec. 11, 1995.
Berreman et al. (1990) Use of trilevel resists for high-resolution soft-x-ray projection lithography, *Appl. Phys Lett.* 56 (22), May 28, 1990, p. 2180.
Black et al. (2001) Integration of self-assembled diblock copolymers for semiconductor capacitor fabrication, *Applied Physics Letters*, vol. 79, No. 3, Jul. 16, 2001, pp. 409-411.
Black et al. (2004) High-Capacity, Self-Assembled Metal-Oxide-Semiconductor Decoupling Capacitors, *IEEE Electron Device Ltrs*, vol. 25, No. 9, Sep. 2004.
Boltau et al. (1998) Surface-induced structure formation of polymer blends on patterned substrates, *Nature*, vol. 391, Feb. 1998, p. 877.
Broseta et al. (1990) Phase equilibria in copolymer/homopolymer ternary blends: Molecular weight effects, *J. Chem. Phy.*, 93(4), Aug. 15, 1990.
Burgaz et al. (2000) T-Junction Grain Boundaries in Block Copolymer-Homopolymer Blends, *Macromolecules*, vol. 33, pp. 8739-8745.

Campbell et al. (2000) Fabrication of photonic crystals for the visible spectrum by holographic lithography, Nature, vol. 404, Mar. 2, 2000, p. 53.
Cardinale et al. (1999) Demonstration of pattern transfer into sub-100 nm polysilicon line/space features patterned with extreme ultraviolet lithography, *J. Va. Sci. Technol.B* vol. 17(6), Nov./Dec. 1999.
Chan et al. (1999) Ordered Bicontinuous Nanoporous and Nanorelief Cermamic Films from Self Assembling Polymer Precursors, *Science*, 286, 1716 (1999); DOI: 10.1126/science.386.5445.1716.
Chen et al. (1998) Morphology of thin block copolymer fiilms on chemically patterned substrates, Journal of Chemical Physics, Apr. 22, 1998, vol. 108, No. 16, p. 6897.
Cheng et al (2001) Formation of a Cobalt Magnetic Dot Array viz Block Copolymer Lithography, *Adv Mater 2001*, 13, No. 15 Aug. 3, 2001, p. 1174.
Cheng et al. (2002) Fabrication of nanostructures with long-range order using block copolymer lithography, *Applied Physics Letters*, vol. 81, No. 19, Nov. 4, 2002, p. 3657.
Cheng et al. (2003) Templated Self-Assembly of Block Copolymers: Effect of Substrate Topography, *Advanced Materials* 2003, vol. 15, No. 19, Oct. 2, pp. 1599-1602.
Cheng et al.(2001) Formation of a Cobalt Magnetic Dot array via Block Copolymer Lithography, *Advanced Materials*, 2001, vol. 13, No. 15, Aug. 3, pp. 1174-1178.
Corvazier et al. (2001) Lamellar phases and microemulsions in model ternary blends containing amphiphilic block copolymers, The Royal Society of Chemistry, J. Mater. Chem, 2001, 11, pp. 2864-2874.
Coulon et al. (1989) Surface-Induced Orientation of Symmetric, Diblock Copolymers: A Secondary Ion Mass Spectrometry Study, *Macromolecules*, vol. 22, pp. 2581-2589.
Coulon et al. (1993) Time Evolution of the Free Surface of Ultrathin Copolymer Films, Macromolecules, vol. 26, pp. 1582-1589.
Daoulas et al. (2006) Fabrication of Complex Three-Dimensional Nanostructures from Self-Assembling Block Copolymer Matrials on Two-Dimensional Chemically Patterned Templates with Mismatched Symmetry, *Physical Review Letters*, Jan. 27, 2006, PRL 96, 036104.
Daoulas et al. (2006) Morphology of multi-component polymer systems: single chain in mean field simulation studies, *The Royal Society of Chemistry, Soft Matter*, 2006, vol. 2, pp. 573-583.
Düchs et al. (2003) Fluctuation Effects in Ternary AB +A +B Polymeric Emulsions, Macromolecules V36, pp. 9237-9248.
Düchs et al. (2004) Formation and structure of the microemulsion phase in two-dimensional ternary AB+A+B Polymeric emulsions, Jnl of Chem Phy, vol. 121, No. 6, Aug. 8, 2004, p. 2798.
Edwards et al. (2004) Precise Control over Molecular Dimensions of Block-Copolymer Domains Using the Interfacial Energy of Chemically Nanopatterned Substrates, *Advanced Materials*,2004, vol. 16, No. 15, Aug. 4, pp. 1315-1319.
Fasolka et al. (2000) Morphology of Ultrathin Supported Diblock Copolymer Films: Theory and Experiment, *Macromolecules* vol. 33, pp. 5702-5712.
Floudas et al. (1997) Microphase separation in block copolymer/homopolymer blends: Theory and experiment, *J. Chem. Phys.* 106 (8), Feb. 22, 1997, p. 3318.
Fukukawa et al. (2005) Synthesis and Characterization of Silicon-Containing Block Copolymers from Nitroside-Mediated Living Free Radical Polymerization, Macromolecules vol. 38, pp. 263-270.
Helfand et al. (1972) Theory of the Interface between Immiscible Polymers,II, Journal of Chemical Physics, vol. 56, No. 7, Apr. 1, 1972.
Hillmyer et al. (1991) Model Bicontinuous Microemulsions in Ternary Homopolymer/Block Copolymer Blends, J. Phy. Chem. B 1999, 103, pp. 4814-4824.
Huang et al. (1991) Modeling Copolymer Adsorption on Laterally Heterogeneous Surfaces, Physical Review Letters, Feb. 4, 1991, vol. 66, No. 5, p. 620.
Jeong et al. (2002) Asymmetric Block Copolymers with Homopolymers: Routes to Multiple Length Scale nanostructures, Adv. Mater 2002.,14, No. 4, Feb. 19, 2002, p. 274.

(56) References Cited

OTHER PUBLICATIONS

Jeong et al. (2003) Precise Control of Nanopore Size in Thin Film Using Mixtures of Asymmetric Block Copolymer and Homopolymer, Macromolecules 2003, 36, pp. 10126-10129.

Kim et al. (2000) Chemical Modification of Self-Assembled Monolayers by Exposure to Soft X-rays in Air, J. Phys. Chem.,vol. 104, No. 31, 2000, pp. 7403-7410.

Kim et al. (2003) Epitaxial self-assembly of block copolymers on lithographically defined nanopatterned substrates, Nature,vol. 424, Jul. 24, 2003, Nature Publishing Group, p. 411.

Krishnan et al. (2001) Shear-Induced Nano-Macro Structural Transition in a Polymeric Bicontinuous Microemulsion, Phy Rev Ltrs, vol. 87, No. 9, Aug. 27, 2001, p. 098301-1.

Li et al. (2000) Dense arrays of ordered GaAs nanostructures by selective area growth on substrates patterned by block copolymer lithography, Applied Physics Letters, vol. 76, No. 13, Mar. 27, 2000, pp. 1689-1691.

Mansky et al. (1997) Ordered Diblock Copolymer Films on Random Copolymer Brushes, Macromolecules 1997, 30, pp. 6810-6813.

Mansky et al. (2006) Controlling Polymer-Surface Interactions with Random Copolymer Brushes, http://www.jstor.org/, Wed. Aug. 16, 2006.

Messe et al. (2003) Effect of the Molecular weight of the homopolymers on the morphology in ternary blends of polystyrene, polyisoprene, polystyrene-block-polyisoprene copolymer, Polymer, 44 (2003) pp. 7397-7403.

Morkved et al. (1999) Dynamics of ternary polymer blends: Disordered, ordered and biconticuous microemulsion phases, Faraday Discuss.,1999, 112, pp. 335-350.

Morkved et al. (2001) Static and Dynamic Scattering from Ternary Polymer Blends: Bicontinuous Microemulsions, Lifshitz lines, and amphiphilicity, Jnl of Chem Phy, V.114, No. 16, Apr. 22, 2001, p. 7247.

Mortensen et al. (2000) Ternary mixture of homopolymer blend and diblock copolymer studied near the Lifshitz composition by small-angle neutron scattering, J. Appl. Cryst., 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, Jnl of Polymer Science: Part B: Polymer Physics, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, IEEE Trans.on Magnetics, vol. 38, No. 5, Sep. 2002, p. 1949.

Orso et al. (1999) Phase Behavior of Thin Film Blends of Block Copolymers and Homopolymers: Changes in Domain Dimensions, Macromolecules, 32, pp. 1087-1092.

Park et al. (1997) Block Copolymer Lithography: Periodic Arrays of ~$10^{11}$ Holes in 1 Square Centimeter, Science, vol. 276, May 30, 1997, pp. 1401-1404.

Park et al. (2003) Enabling nanotechnology with self assembled block copolymer patterns, Polymer, vol. 44 (2003) pp. 6725-6760; www.sciencedirect.com.

Pereira et al. (1998) Diblock Copolymer Thin Films on Heterogeneous Striped Surfaces: Commensurate, Incommensurate and inverted Lamellae, Physical Review Letters, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, Langmuir, vol. 16, No. 10, 2000, pp. 4625-4631.

Rockford et al. (1999) Polymers on Nanoperiodic, Heterogeneous Surfaces, Phy. Rev. Ltrs, The American Physical Society, vol. 82, No. 12, p. 2602.

Russell et al. (1989) Characteristics of the Surface-Induced Orientation for Symmetric Diblock PS/PMMA Copolymers, Macromolecules, vol. 22, pp. 4600-4606.

Schattenburg et al. (1995) Optically matched trilevel resist process for nanostructure fabrication, J. Vac. Sci Technol. B, 15(6), Nov./Dec. 1995, p. 3007.

Schwahn et al. (1999) Crossover from 3D Ising to Isotropic Lifshitz Critical Behavior in a Misture of a Homopolymer Blend and Diblock Phy. Rev. Ltrs, The American Physical Society, vol. 82, No. 25, Jun. 21, 1999, p. 5056.

Schwahn et al. (2000) Thermal Composition fluctuations near the isotropic Lifshitz critical point in a ernary mixture of a homopolymer blend and diblock copolymer, Jnl. Chem. Phy., vol. 112, No. 12, Mar. 22, 2000, p. 5454.

Solak, Harun H. (2006) Nanolithography with coherent extreme ultraviolet light, Jnl. of Physics D: App. Phys, 39 (2006) R171-R188.

Stoykovich et al. (2005) Directed Assembly of Block Copolymer Blends into Nonregular Device-Oriented Structures, Science, vol. 308, Jun. 3, 2005, www.sciencemag.org, p. 1442.

Stoykovich et al. (2006) Block Copolymers and Conventional Lithogrphy, Materialstoday, vol. 9, No. 9, Sep. 2006, p. 20.

Stoykovich et al. (2006) Phase Behavior of Symmetric Ternary Block Copolymer-Homopolymer Blends in Thin Films and on Chemically Patterned Surfaces, Physical Review Letters, Oct. 6, 2006, PRL 97, 147802 (2006).

Teubner et al. (1987) Origin of the Scattering Peak in Microemulsions, J. Chem. Phys., 87(5), Sep. 1, 1997, p. 3195.

Thurn-Albrecht et al. (2000) Nanoscopic Templates from Oriented Block Copolymer Films, Communications, Advanced Materiels, vol. 12, No. 11, pp. 787-791.

Thurn-Albrecht et al. (2000) Ultrahigh-Density Nanowire Arrays Grown in Self-Assembled Diblock Copolymer Templates, Science, Dec. 15, 2000, vol. 290, pp. 2126-2129.

Torikai et al. (1997) Lamellar Domain Spacings of Diblock Copolymer/Homopolymer Blends and Conformations of Block Chains in Their Microdomains, Macromolecules, 30, pp. 5698-5703.

Urbas et al. (2000) Tunable Block Copolymer/Homopolymer Photonic Crystals, Advanced Materials, vol. 12, No. 11 p. 812.

Urbas et al. (2002) Bicontinuous Cubic Block Copolymer Photonic Crystals, Advanced Materials, vol. 14, No. 24, Dec. 17, 2002, p. 1850.

Wang et al. (2000) Symmetric diblock copolymer thin films confined between homogeneous and patterned surfaces: Simulations and theory, Journal of Chemical Physics, vol. 112, No. 22, Jun. 8, 2000, pp. 9996-10010.

Whitesides et al. (1991) Molecular self-Assembly and Nanochemistry: A Chemical Strategy for the Synthesis of Nanostructures, Articles, Science vol. 254, p. 1312, Nov. 29, 1991.

Whitesides et al. (2002) Self-Assembly at All Scales, Science, AAAS, 295, p. 2418.

Xu et al. (2001) The Influence of molecular weight on nanoporous polymer films, Polymer, 42 (2001) pp. 9091-9095; www.elsevier.com/locate/polymer.

Yang et al. (2000) Guided Self-Assembly of Symetric Diblock Copolymer Films Chemically Nanopatterned Substrates, Macromolecules 2000, 33, pp. 9575-9582.

Nealey, Paul Franklin, et al., "Density Multiplication and Improved Lithography by Directed Block Copolymer Assembly," U.S. Appl. No. 12/329,484, filed Dec. 5, 2008.

International Search Report and Written Opinion of the International Searching Authority mailed Aug. 24, 2009, Application No. PCT/US 2008/085742, 14 pages.

Park, C., et al., "Enabling Nanotechnology with Self Assembled Block Copolymer Patterns," Polymer, Elsevier Science, Publishers B.V., GB, vol. 44, No. 22, Oct. 1, 2003, pp. 6725-6760.

Black, C.T., et al, "Polymer Self Assembly in Semiconductor Microelectronics," IBM Journal of Research and Development, International Business Machines Corporation, New York, vol. 51, No. 5, Sep. 1, 2007, XP007905680, pp. 605-633.

Stuen, K., et al., "Imaging Layers for the Directed Assembly of Block Copolymer Films: Dependence of the Physical and Chemical Properties of Patterned Polymer Brushes on Brush Molecular Weight," Journal of Vacuum Science and Technology, Part B, AVS/AIP, Melville, New York, vol. 25, No. 6, Dec. 6, 2007, pp. 1958-1962.

Stoykovich, M.P., et al, "Block Copolymers and Conventional Lithography," Materials today, Elsevier Science, Kidlington, GB, vol. 9, No. 9, Sep. 1, 2006, pp. 20-29.

(56) References Cited

OTHER PUBLICATIONS

Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.

Nealey, Paul Franklin, et al., "Methods and Compositions for Forming a Periodic Patterned Copolymer Films," U.S. Appl. No. 11/286,260, filed Nov. 22, 2005.

U.S. Office Action mailed Jul. 31, 2009, from U.S. Appl. No. 11/286,260.

Nealey, Paul Franklin, "Fabrication of Complex Three-Dimensional Structures Based on Directed Assembly of Self-Assembling Materials on Activated Two-Dimensional Templates," U.S. Appl. No. 11/545,060, filed Oct. 5, 2006.

U.S. Office Action mailed Apr. 3, 2009, from U.S. Appl. No. 11/545,060.

Stoykovich, Mark P., et al., "Methods and Compositions for Forming Patterns With Isolated or Discrete Features Using Block Copolymer Materials," U.S. Appl. No. 11/879,758, filed Jul. 17, 2007.

U.S. Office Action mailed Jul. 23, 2009, from U.S. Appl. No. 11/545,060.

U.S. Office Action mailed Jan. 25, 2010, from U.S. Appl. No. 11/286,260.

U.S. Office Action mailed Nov. 30, 2009, from U.S. Appl. No. 11/545,060.

Bates, et al., "Block Copolymers—Designer Soft Materials," Physics Today, Feb. 1999, 7 pages.

Bohbot-Raviv, et al., "Discovering New Ordered Phases of Block Copolymers," The American Physical Society, vol. 85, No. 16, Oct. 16, 2000, 4 pages.

Craig, et al., "Self Assembly of Block Copolymers on Lithographically Defined Nano Patterned Substrate," Journal of Photopolymer Science & Technology, vol. 20, No. 4, Jun. 4, 2007, 7 pages.

Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.

Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.

Detcheverry, et al., Monte Carlo Simulation of Coarse Grain Polymeric Systems, *The American Physical Society*, May 15, 2009, PRL 102(19) 197801(4), pp. 197801-1-197801-4.

Detcheverry, et al., "Theoretically Informed Coarse Grain Simulations of Polymeric Systems," Foraday Discussions 144, (2010) 111-125.

Detcheverry, et al., Monte Carlo Simulations of a Course Grain Model for Block Copolymers and Nanocomposites, published Jun. 11, 2008, vol. 41, pp. 4989-5001.

Edwards, et al., Binary Blends of diblock Copolymers as an Effective route to Multiple, Length Scales in Perfect Directed Self-Assembly of Diblock Copolymer Thin Films, J. Vac. Sci., Technol., vol. 24, No. 1, Jan./Feb. 2006, pp. 340-349.

Edwards, et al., "Long-Range Order and Orientation of Cylinder-Forming Block Copolymers on Chemically Nanopatterned Striped Surfaces," *American Chemical Society*, Macromolecules, published Apr. 13, 2006, vol. 39, pp. 3598-3607.

Edwards, et al., "Mechanism and Kinetics of Ordering in Diblock Copolyer Thin Films on Chemically Nanopatterned Substrates," *Journal of Polymer Science*: Part B, Polymer Physics, 2005, vol. 43, pp. 3444-3459.

Ekinci, et al., "20 nm Line/Space Patterns in HSQ Fabricated by EUV Interference Lithography," Photon Lithography, MNE 2006 Micro- and Nano-Engineering, 2 pages.

Galatsis, K., et al., Patterning and Templating for Nanoelectronics., *Advanced Materials*, 2010, vol. 22, pp. 769-778.

Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.

Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.

Hirai, et al., "One-Step Direct-Patterning Template Utilizing Self-Assembly of POSS-Containing Block Copolymers," *Adv. Mater.*, 2009, vol. 21, pp. 4334-4338.

Hong, A., et al., "Metal Nanodot Memory by Self-Assembled Block Copolymer Lift-Off," *American Chemical Society*, Nano Left 2010, vol. 10, pp. 224-229.

In, et al., Side-Chain-Grafted Random Copolymer Brushes as Neutral Surfaces for Controlling the Orientation of Block Copolymer Microdomains in Thin Films, American Chemical Society, Langmuir, published Aug. 1, 2006, vol. 22, pp. 7855-7860.

Ji, et al., "Generalization of the Use of Random Copolymers to Control the Wetting Behavior of Block Copolymer Films," American Chemical Society, published Nov. 11, 2008, vol. 41, pp. 9098-9103.

Ji, et al., "Preparation of Neutral Wetting Brushes for Block Copolymer Films from Homopolymer Blends," Advanced Materials, 2008 vol. 20, pp. 3054-3060.

Ji, Shengxiang, et al., "Molecular Transfer Printing Using Block Copolymers," *ACSNano* vol. 4, No. 2, 2010, pp. 599-609.

Kang, et al., "Control of the Critical Dimensions and Line Edge Roughness With Pre-Organized Block Copolymer Pixelated photoresists," *J. Vac. Sci. Technol.* vol. 27, No. 6, Nov./Dec. 2009, pp. 2993-2997.

Kang, et al., "Hierarchical Assembly of Nanoparticle Superstructures from Block Copolymer-Nanoparticle Composites," published Apr. 9, 2008, vol. 100(4), pp. 148303-1-148303-4.

Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol.*, vol. 26, No. 5, Nov./Dec. 2008, pp. 2495-2499.

Kim, et al., "Defect Structure in Thin Films of a Lamellar Block Copolymer Self-Assemble on Neutral Homogeneous and Chemically Nanopatterned Surfaces," *American Chemical Society*, Macromolecules, published Jul. 13, 2006, vol. 39, 5466-5470.

Kim, et al., "Synthesis of Photacid Generator-Containing Patternable Diblock Copolymers by Reversible Addition—Fragmentation Transfer Polmerization," Chemistry of Materials, *American Chemical Society*, Jul. 6, 2009, pp. 3030-3032.

La, et al., "Directed Assembly of Cylinder-Forming Block Copolymer Films and Thermochemically Induced Cylinder to Sphere Transition: A Hierarchical Route to Linear Arrays of Nanodots," Nano Letter 2005, published May 28, 2005, *American Chemical Society*, vol. 5, No. 7, pp. 1379-1384.

La, et al, "Directed Assembly of Cylinder-Forming Block Copolymers into Patterned Structures to Fabricate Arrays of Spherical Domains and Nanoparticles," *Chemistry of Materials*, 2007:19(18), pp. 4538-4544.

Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.

Liu, et al., "Phase Behavior and Dimensional Scaling of Symmetric Block Copolymer-Homopolymer Ternary Blends in Thin Films," *American Chemical Society*, Macromolecules, vol. 42 Mar. 26, 2009, pp. 3063-3072.

Morin, et al., "Assembly of Nanocrystal Arrays by Block-Copolymer-Directed Nucleation," Angew. Chem. Inc., Ed. 2009, vol. 48, pp. 2135-2139.

Nakano, et al., Single-Step Single-Molecure PCR of DNA with a Homo-Priming Sequence Using a Single Primer and Hot-Startable DNA Polymerase, *Journal of Bioscience and Bioengineering*, 2000, vol. 90 No. 4, pp. 456-458.

Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.

(56) References Cited

OTHER PUBLICATIONS

Park, et al., "Characterization of Cylinder-Forming Block Copolymers Directed to Assemble on Spotted Chemical Patterns," *American Chemical Society*, Macromolecules, Published Nov. 4, 2008, vol. 41, pp. 9118-9123.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Park, et al., "Selective Growth and Characterization of InGaAs Quantum Dots on Patterned InP Substrates Utilizing A Diblock Copolymer Template," *IEEE* 978-4244-3433-6/09, copyright 2009, pp. 52-54.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Peters, et al., "Combining Advanced Lithographic Techniques and Self-Assembly of Thin Films of Diblock Copolymers to Produce Templates for Nanofabrication," *J. Vac Sci. Technol.*, vol. 18(6), Nov./Dec. 2000, pp. 3530-3534.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Pike, et al., "Theoretically Informed Coarse Grain Simulations of Polymeric Systems," *The Journal of Chemical Physics*, Published Aug. 27, 2009, vol. 131, pp. 084903-1to 084903-10.

Ruiz, et al., "Density Multiplication and Improved Lithography by Directed block Copolymer Assembly," Science, vol. 321, Aug. 15, 2008, pp. 936-939.

Solak, et al., "Sub-50 nm Period Patterns With EUV Interference Lithography," Microelectronic Engineering 67-68 (2003) 56-62.

Son, et al., "Placement Control of Nanomaterial Arrays on the Surface-Reconstructed Block Copolymer Thin Films," *ACSNano*, vol. 3, No. 12, 2009, pp. 3927-3934.

Son, et al., "Surfactant-Assisted Orientation of Thin Diblock Copolyer films," *Advanced Materials*, 2008, vol. 20, pp. 3643-3648.

Stoykovich, M.P., et al, "Remediation of Line Edge Roughness in Chemical Nanopatterns by the Directed Assembly of Overlying Block Copolymer Films," Macromolecules, American Chemical Society, vol. 43, Feb. 10, 2010, pp. 2334-2342.

Stuen, et al., In situ Characterization of Block Copolymer Ordering on Chemically Nanopatterned Surfaces by time-resolved small angle X-ray Scattering, *J. Vac. Sci. Technol.* vol. 26(6), published Dec. 1, 2008, pp. 2504-2508.

Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.

Suh, Hyo Seon, et al., "Orientation of Block Copolymer Resists on Interlayer Dielectrics with Tunable Surface Energy," American Chemical Society, vol. 43, Nov. 13, 2009, pp. 461-466.

Ting, et al., "Plasma Etch Removal of Poly (methyl methacrylate) in Block Copolymer Lithography," J. Vac. Sci. Technol., vol. 26(5), Sep./Oct. 2008, pp. 1684-1689.

Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.

Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.

Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.

Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.

Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.

Welander, et al., "Impact of Trench Width Roughness on the Graphoepitaxial Assembly of Block Copolymers," *J. Vac Sci. Technol.*, vol. 26(6), Nov./Dec. 2008, pp. 2484-2489.

Welander, et al., "Rapid Directed Assembly of Block Copolymer Films at Elevated Temperatures," *American Chemical Society*, Macromolecules, vol. 41, Published Apr. 1, 2008, pp. 2759-2761.

Xiao, et al., "Graphoepitaxy of Cylinder-forming Block Copolymers for Use as Templates to Pattern Magnetic Metal Dot Arrays," Institute of Physics Publishing, Nanotechnology, vol. 16, 2005, pp. S324-S329.

Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.

Yang, et al., "Patterning of Self-Assembled Monolayers with Lateral Dimensions of 0.15 um Using Advanced Lithography," *J. Vac Sci. Technol.*, vol. 17(6), Nov./Dec. 1999, pp. 3203-3207.

Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.

Nealey, Paul Franklin, et al., "Molecular Transfer Printing Using Block Copolymers," U.S. Appl. No. 12/416,816, filed Apr. 1, 2009.

International Search Report and Written Opinion of the International Searching Authority mailed Dec. 16, 2009, Application No. PCT/US2009/039208.

U.S. Final Office Action mailed Mar. 8, 2010, from U.S. Appl. No. 11/545,060.

U.S. Office Action mailed Jun. 25, 2010, from U.S. Appl. No. 11/286,260.

U.S. Office Action mailed Jul. 12, 2010, from U.S. Appl. No. 11/545,060.

U.S. Office Action mailed Jul. 23, 2009, from U.S. Appl. No. 11/879,758.

U.S. Final Office Action mailed Mar. 8, 2010, from U.S. Appl. No. 11/879,758.

Notice of Allowance mailed Nov. 2, 2011 for U.S. Appl. No. 12/416,816.

Allowed Claims as of Nov. 2, 2011 for U.S. Appl. No. 12/416,816.

Notice of Allowance mailed Nov. 4, 2011 for U.S. Appl. No. 11/879,758.

Allowed Claims as of Nov. 4, 2011 for U.S. Appl. No. 11/879,758.

Notice of Allowance mailed Dec. 21, 2011, for U.S. Appl. No. 11/545,060.

Allowed Claims as of Dec. 21, 2011, for U.S. Appl. No. 11/545,060.

Todo et al., "Domain-Boundary Structure of Styrene-Isoprene Block Copolymer Films Cast From Solutions .III. Preliminary-Results on Spherical Microdomains," *Polymer Engineering and Science*, 17 (8): 587-597 1977.

Morkved et al., "Local control of microdomain orientation in diblock copolymer thin films with electric fields," Science, 273 (5277): 931-933 Aug. 16, 1996, pp. 931-933.

(56) References Cited

OTHER PUBLICATIONS

Kim, S.H., et al., "Highly oriented and ordered arrays from block copolymers via solvent evaporation," *Advanced Materials*, Feb. 3, 2004, 16 (3), pp. 226-231.
Fasolka, MJ, et al., Block copolymer thin films: Physics and applications, Annual Review of Materials Research, 2001, 31, pp. 323-355.
Tanaka, H, et al., "Ordered Structure in Mixtures of a Block Copolymer and Homopolymers . 1. Solubilizatian of Low-Molecular-Weight Homopolymers," Macromolecules, 24 (1), Jan. 7, 1991, pp. 240-251.
Hamley, et al., Nanostructure fabrication using block copolymers, *Nanotechnology*, Oct. 2003, 14 (10), pp. R39-R54.
Segalman, RA, et al., "Graphoepitaxy of spherical domain block copolymer films," Advanced Materials, Aug. 3, 2001, 13 (15) pp. 1152-1155.
U.S. Office Action mailed Dec. 27, 2010, from U.S. Appl. No. 11/545,060.
Office Action mailed Oct. 7, 2010 for U.S. Appl. No. 12/416,816.
U.S. Final Office Action mailed Dec. 13, 2010, from U.S. Appl. No. 11/286,260.
U.S. Office Action mailed Mar. 15, 2011, from U.S. Appl. No. 11/545,060.
U.S. Office Action mailed Dec. 17, 2010, from U.S. Appl. No. 11/545,060.
Office Action mailed Apr. 20, 2011 U.S. Appl. No. 12/416,816.
Office Action mailed Apr. 21, 2011 for U.S. Appl. No. 12/329,484.
Watanabe, et al., "Smart Block Copolymer Masks With Molecule-Transport Channels for Total Wet Nanopatterning," J. Mater. Chem, 2008, vol. 18, 5482-5491.
Final Office action mailed Jul. 8, 2011, U.S. Appl. No. 11/879,758.
Final Office Action mailed Oct. 14, 2011 for U.S. Appl. No. 12/329,484.
Office Action mailed Aug. 31, 2011 for U.S. Appl. No. 12/416,816.
Final Office Action mailed Sep. 1, 2011, from U.S. Appl. No. 11/545,060.
Supplemental European Search Report mailed Oct. 26, 2011, from U.S. Application No. PCT/US2005/042568.
Stoykovich, et al., "Methods and Compositions for Forming Patterns With Isolated or Discrete Features Using Block Copolymer Materials," filed Feb. 3, 2012, U.S. Appl. No. 13/366,134.
Nealey, Paul Franklin, "Fabrication of Complex Three-Dimensional Structures Based on Directed Assembly of Self-Assembling Materials on Activated Two-Dimensional Templates," U.S. Appl. No. 13/436,341, filed Mar. 30, 2012.
Nealey, Paul Franklin, "Solvent Annealing Block Copolymers on Patterned Substrates," U.S. Appl. No. 13/367,337, filed Feb. 6, 2012.
Japanese Office Action mailed Jul. 3, 2012, Application No. 2007-543480.
Nealey, Paul Franklin, "Improved Patterning in the Directed Assembly of Block Copolymers Using Triblock or Multi-Block Copolymers," U.S. Appl. No. 13/543,667, filed Jul. 6, 2012.
Office Action mailed Apr. 11, 2012 for U.S. Appl. No. 12/329,484.
Office Action mailed Aug. 15, 2012 for U.S. Appl. No. 13/436,341.
Facsko, et al., Formation of Ordered Nanoscale Semiconductor Dots by Ion Sputtering, Science, vol. 285, Sep. 3, 1999 pp. 1551-1553.
Kim, S., et al, "Decoupling Bulk Thermodynamics and Wetting Characteristics of Block Copolymer Thin Films," ACS Macro Lett., American Chemical Society, pp. 11-14.
Notice of Allowance mailed Jun. 7, 2012, for U.S. Appl. No. 11/286,260.
U.S. Office Action mailed Sep. 24, 2012, from U.S. Appl. No. 13/366,134.
Final Office Action mailed Dec. 18, 2012, for U.S. Appl. No. 12/329,484.

* cited by examiner

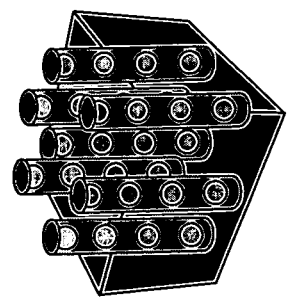
structure h
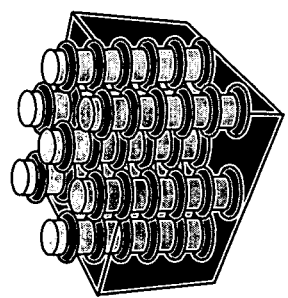
structure g
*FIG. 3B*
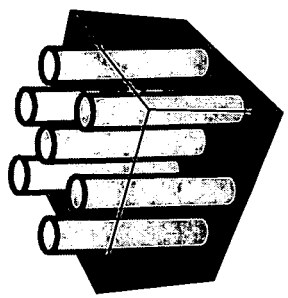
structure f

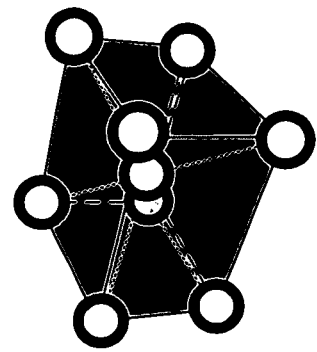
structure k
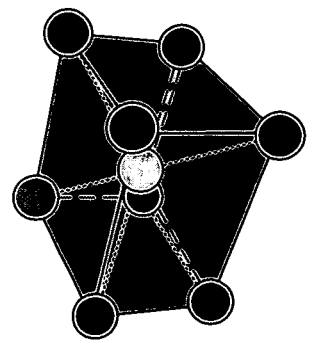
structure j
FIG. 4A
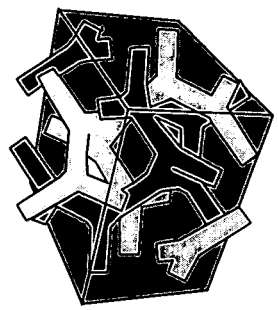
structure l
FIG. 4B
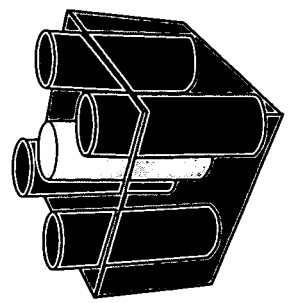
structure i

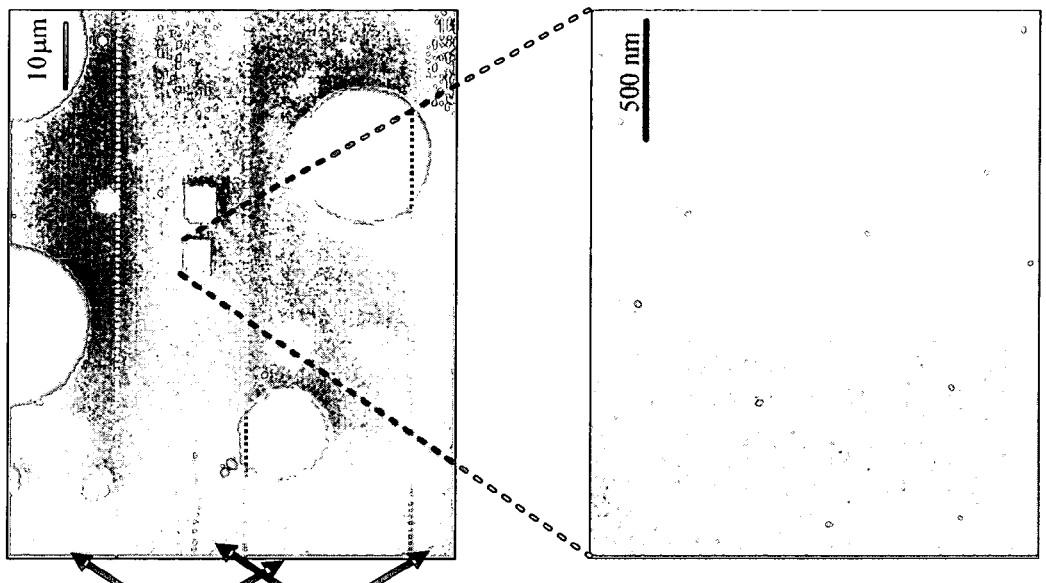
FIG. 8B
FIG. 8C
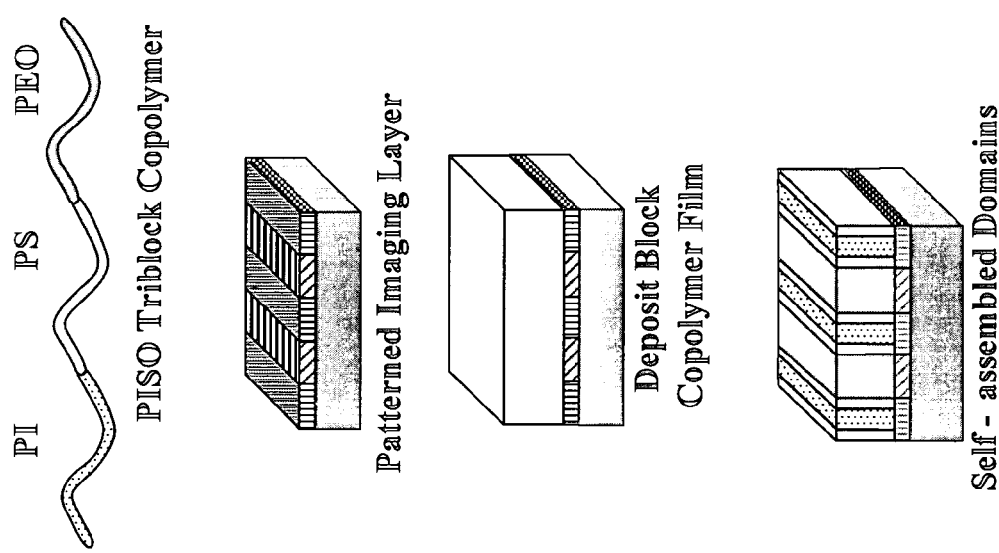
FIG. 8A

Remove Cylinder Block

Deposit Metal Connects

Remove Light Grey Block

Deposit Semi-Conductor

Remove Dark Grey Block

DIRECTED ASSEMBLY OF TRIBLOCK COPOLYMERS

CROSS-REFERENCE TO RELATED APPLICATIONS

This application claims priority under 35 USC §119(e) from U.S. Provisional Application No. 60/726,766, filed Oct. 14, 2005, which is hereby incorporated by reference in its entirety and for all purposes.

FIELD OF THE INVENTION

The invention relates to methods of nanofabrication techniques. More specifically, the invention relates to patterning materials at the nanoscale level utilizing block copolymers.

BACKGROUND OF THE INVENTION

As the development of nanoscale mechanical, electrical, chemical and biological devices and systems increases, new processes and materials are needed to fabricate nanoscale devices and components. This is especially true as the scale of these structures decreases into the tens of nanometers. There is a particular need for materials and methods that are able to duplicate nanoscale patterns over large areas with perfect or near-perfect registration of the pattern features. Block copolymer materials are useful in nanofabrication because they self-assemble into distinct domains with dimensions in the tens of nanometers or lower.

However, existing methods of using block copolymer material suffer from several limitations. Approaches that rely solely on copolymer self-assembly suffer from defects in the patterns. One approach to nanopatterning with block copolymers combines chemical patterning of a substrate by advanced lithographic techniques with the self-assembly of diblock copolymers. The chemical pattern directs the self-assembly of the diblock copolymer, producing perfect or near-perfect duplication of the pattern and registration of the pattern features over a large area.

However, thus far the use of directed self-assembly has been limited to replicating the two-dimensional pattern of the substrate in the diblock copolymer film.

What are needed therefore are methods and compositions for creating block copolymer films with more complex morphologies.

SUMMARY OF THE INVENTION

The present invention provides methods of directed self-assembly of multi-block (i.e., triblock and higher-order) copolymers on patterned substrates. According to various embodiments, the methods involve depositing copolymer materials on substrates configured to drive the assembly of micro-phase separated films that exhibit the same morphology as that copolymer materials in the bulk. In certain embodiments, binary patterns are used to drive the triblock copolymer films. The binary two-dimensional surface patterns are transformed into three-component and three-dimensional structures throughout the thickness of the overlying copolymer films. The films formed may be characterized by one or more of the following: 1) each phase is registered with the underlying substrate, 2) each phase is addressable at the substrate and the surface of the film and 3) the morphology is perfectly organized or ordered over arbitrarily large areas. The morphology of the registered and addressable film may be any that triblock (or higher order) copolymers self-assemble into in the bulk, including morphologies of discrete and multiple continuous domains. Applications of the methods and compositions of the invention include forming masks for further processing steps, for example, in semiconductor processing and forming nanoscale functional features, for example, conductive lines or contacts.

BRIEF DESCRIPTION OF THE DRAWINGS

FIG. 3B shows examples of triblock copolymer structures that may be formed using activated two-dimensional templates patterned with hexagonal arrays of spots according to methods of the present invention.

FIG. 4A shows examples of triblock copolymer structures that may be formed using activated two-dimensional templates patterned with square arrays of spots according to methods of the present invention.

FIG. 4B shows an example of a multiply continuous triblock copolymer structure that may be formed using the methods of the present invention.

FIG. 8A shows a schematic representation of a procedure used to create nanopatterned substrates and direct the assembly of a triblock PISO copolymer according to a method of the present invention.

FIG. 8B is an SEM micrograph of a nanopatterned surface that was patterned using the procedure depicted in FIG. 8A.

FIG. 8C is an SEM micrograph of lamellar domains directed to assemble perpendicular to the substrate depicted in FIG. 8B.

DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention relates to complex block copolymer structures and methods of fabricating them. Whereas directed self-assembly of block copolymers has previously focused on diblock copolymers, the methods of the invention use triblock and higher order copolymers to create more complex structures. The applications and uses of these structures are substantially greater than possible with diblock copolymers. More information may be encoded than possible with diblock copolymers (e.g., as a photoresist for pattern transfer) and patterning and manufacturing in three-dimensions using copolymer materials is possible.

According to various embodiments, the present invention provides methods of directing the assembly of triblock (and higher order) copolymers of different compositions into a number of fabrication templates with complex architectures and perfect ordering over areas as large as chips, throughout films that are thick enough to be considered (from a device manufacturing standpoint) three-dimensional, and precisely registered with the underlying substrate. In certain embodiments, assembly is directed by simple binary two-dimensional patterns in chemical functionality. The patterns may be lithographically defined.

Figure 1:
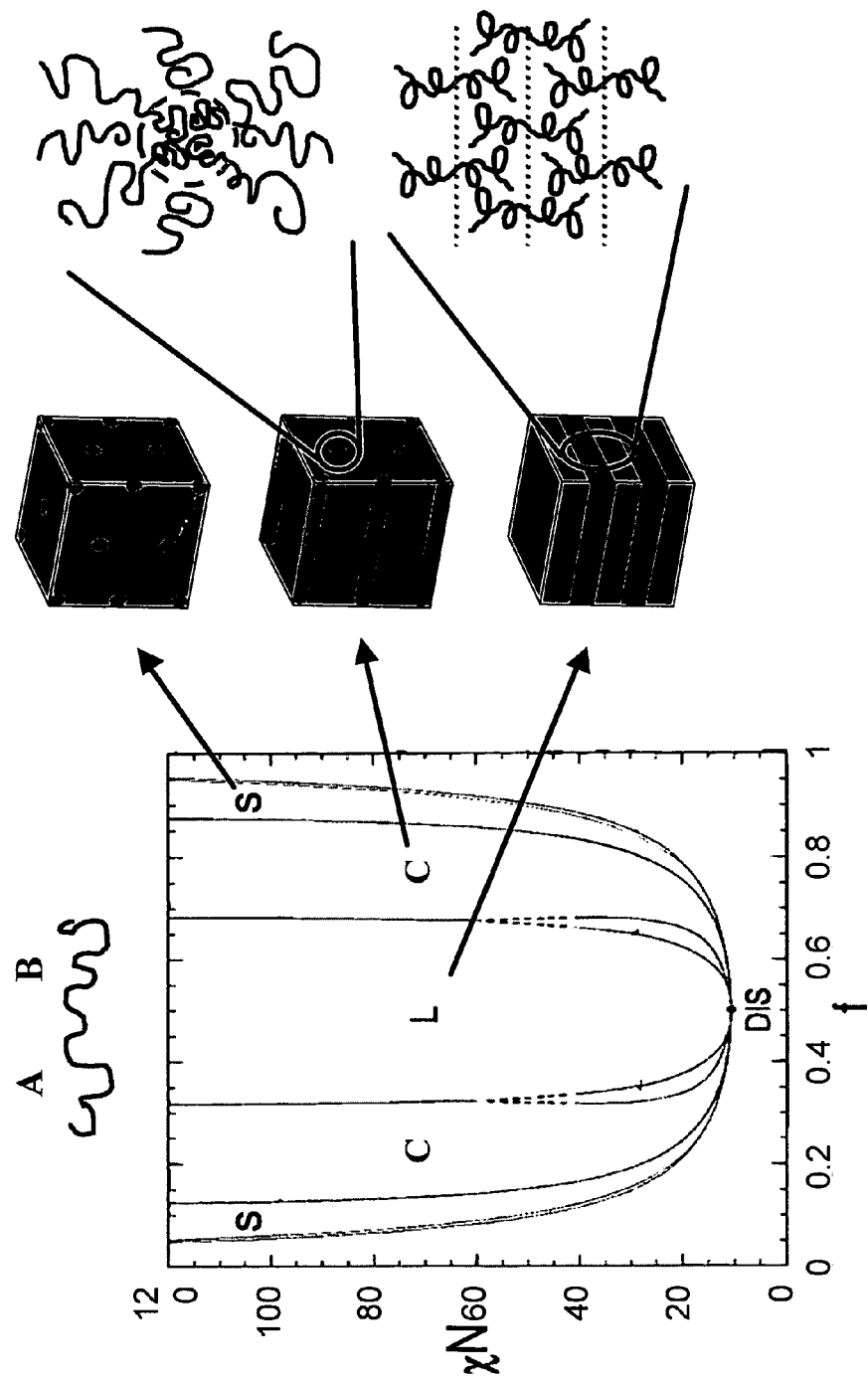
FIG. 1 shows ideal phase behavior of diblock copolymers.
Figure 2:
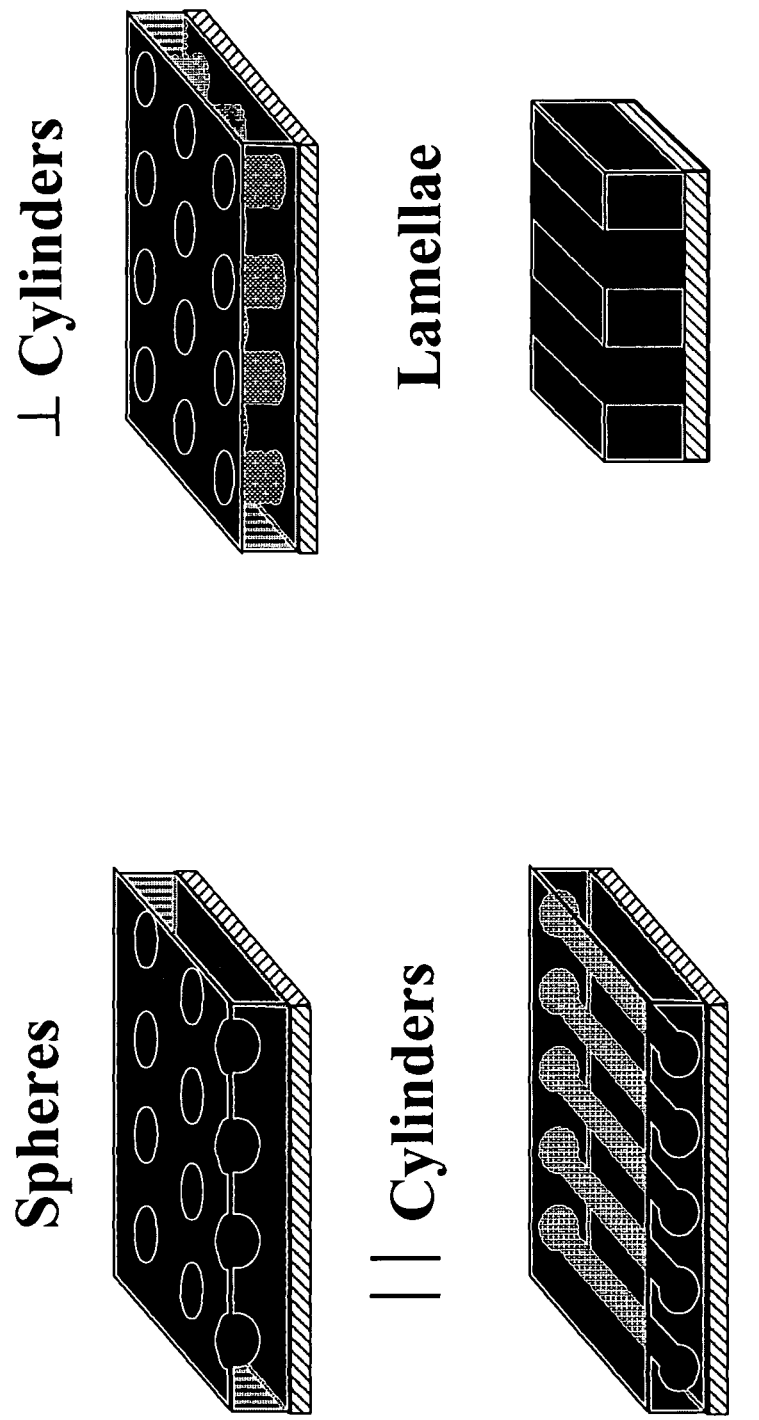
FIG. 2 shows spherical, cylindrical and lamellar ordered copolymer domains formed on substrates.

Block copolymers are a class of polymers synthesized from two or more polymeric blocks. Diblock copolymer AB (or A-b-B) may be represented as, for example, AAAAAAA-BBBBBBBB, etc., with each "A" or "B" representing a monomer. The size of each block may be varied. As indicated above, block copolymers self-segregate into individual domains under appropriate conditions. FIG. 1 illustrates the ideal phase behavior of a diblock copolymer AB. The graph in FIG. 1 shows, $\chi^N$ (where $\chi$ is the Flory-Huggins interaction parameter and N is the degree of polymerization) as a function of the volume fraction, f, of a block (A) in a diblock (A-b-B) copolymer. $\chi^N$ is related to the energy of mixing the blocks in a diblock copolymer and is inversely proportional to temperature. FIG. 1 shows that at a particular temperature and volume fractions of A and B, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown to the right of the graph. Domain size typically ranges from 5-50 nm. FIG. 2 shows spherical, cylindrical and lamellar ordered domains formed on substrates. Domains (spheres, cylinders or lamellae) of one block of the copolymer are surrounded by the other block copolymer. As shown in FIG. 2, cylinders may form parallel or perpendicular to the substrate.

Although the FIGS. 1 and 2 show phase behavior of diblock copolymers for illustrative purposes, the phase behavior of block copolymers containing more than two types of blocks (e.g., A-b-B-b-C) also results in microphase separation into different domains. FIGS. 3A-4B show examples of ABC triblock copolymers separated into different domains. The size and shape of the domains depend on the molecular weight and composition of the copolymer. These triblock copolymers are discussed further below.

Block copolymers self-assemble into these microphase domains at certain conditions, as described above with reference to FIG. 1. However, undirected self-assembly is not appropriate for applications requiring registration of domains with the underlying substrate and the creation of addressable arrays. Directed self-assembly of block copolymers may be used to fabricate features in the tens of nanometers—dimensions at which lithographic techniques are impractical or impossible.

As indicated above, thus far, methods of directing self-assembled copolymer films involve growing diblock copolymers vertically up from the two-dimensional patterned substrate to replicate the pattern in the film. The present invention provides methods of directed self-assembly of multi-block (i.e., triblock and higher-order) copolymers on patterned substrates.

According to various embodiments, the films formed may be characterized by one or more of the following: 1) each phase is registered with underlying substrate, 2) each phase is addressable at the substrate and the surface of the film, and 3) the morphology is perfectly organized or ordered over arbitrarily large areas and throughout films as thick as about 0.5 to 1 micron.

According to various embodiments, the methods involve depositing a triblock or higher order copolymer material on a substrate having a pattern, the geometry of which corresponds to a 2-D projection of the bulk morphology of the copolymer material. The geometry matches the 2-D projection in symmetry and/or length scale. In particular embodiments, the geometry matches the components in symmetry and length scale.

In certain embodiments, the methods involve depositing a triblock or higher order copolymer material on a substrate having a pattern the geometry of which corresponds to a 2-D projection of the bulk morphology of one or more components of the copolymer material. The geometry matches the 2-D projection in symmetry and/or length scale, in particular embodiments in both symmetry and length scale.

In certain embodiments, the methods involve depositing a triblock copolymer material on substrate having a binary pattern the geometry of which corresponds to a 2-D projection of the bulk morphology of one of the components of the copolymer material. The geometry matches the 2-D projection in symmetry and/or length scale, in particular embodiments, in both symmetry and length scale. The binary patterns drive the assembly of the triblock copolymer films. Unlike in previous methods in which binary surface patterns are used only to replicate the pattern in the two diblock copolymer domains, the binary two-dimensional surface pattern is transformed into a three-component and three-dimensional structure throughout the thickness of the overlying copolymer film. The result is significantly more complex structures as the morphology of the film may be any that triblock copolymers self-assemble into in the bulk including morphologies of discrete and multiple continuous domains.

Figure 3A:
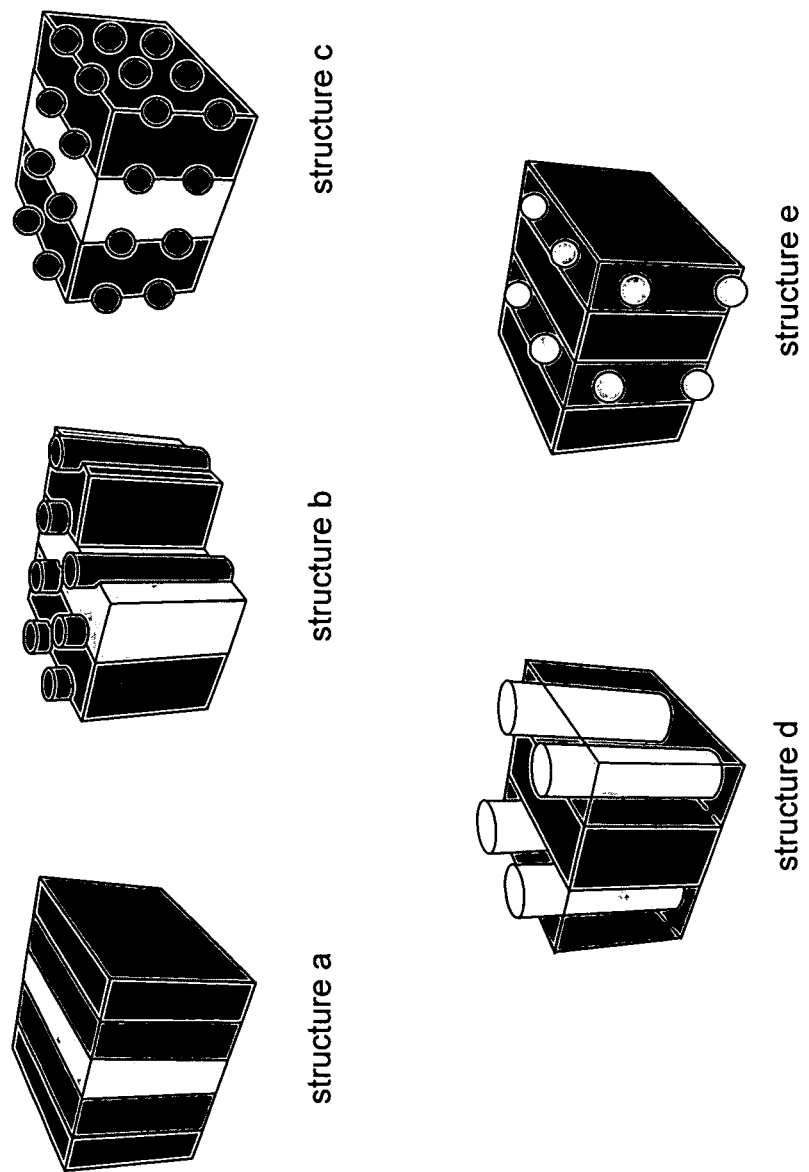
FIG. 3A shows examples of triblock copolymer structures that may be formed using activated two-dimensional templates patterned with alternating stripes.

FIGS. 3A-4B show examples of various morphologies that self-assemble from A-b-B-b-C triblock copolymers. Using the methods of the invention, structures that display these morphologies and are registered with the underlying substrate may be formed. The morphologies shown in FIGS. 3A, 3B and 4A are examples of the decorated phases—so called because, for example, a lamellar morphology may be "decorated" with spheres as in structures c and e in FIG. 3A, or with cylinders as in structures b and d. Structures having multiple continuous domains are also within the scope of the invention. A domain is considered continuous if there is a path that connects any two points in that phase that does not enter any other phase. Bicontinuous morphologies have two such phases; the phases of a diblock copolymer exhibiting bicontinuous morphology are interpenetrating meshes, both of which are completely continuous.

Figure 6A:
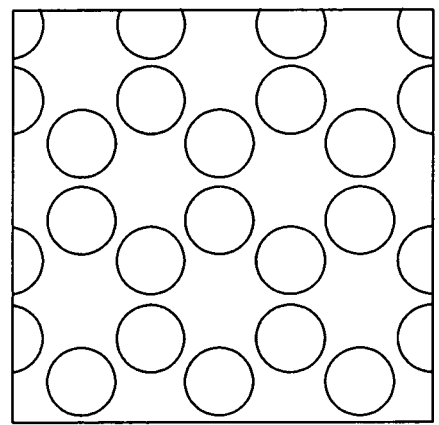
FIG. 6 shows an example of a unit cell of the $Q^{214}$ phase of a triblock copolymer and a rough schematic of the 2-D projection of one of the faces of the unit cell.
Figure 6A:
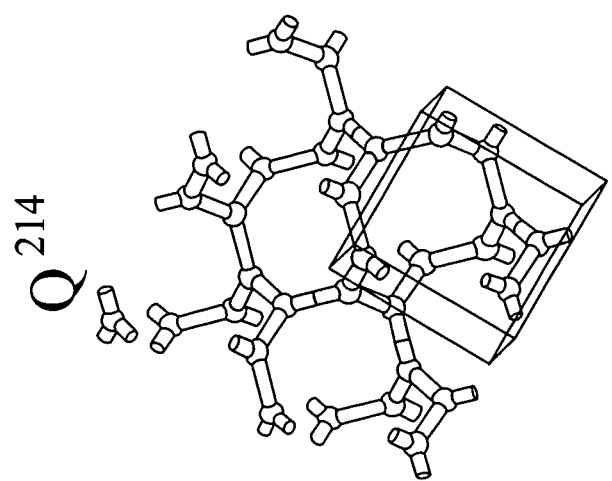
Figure 6B:
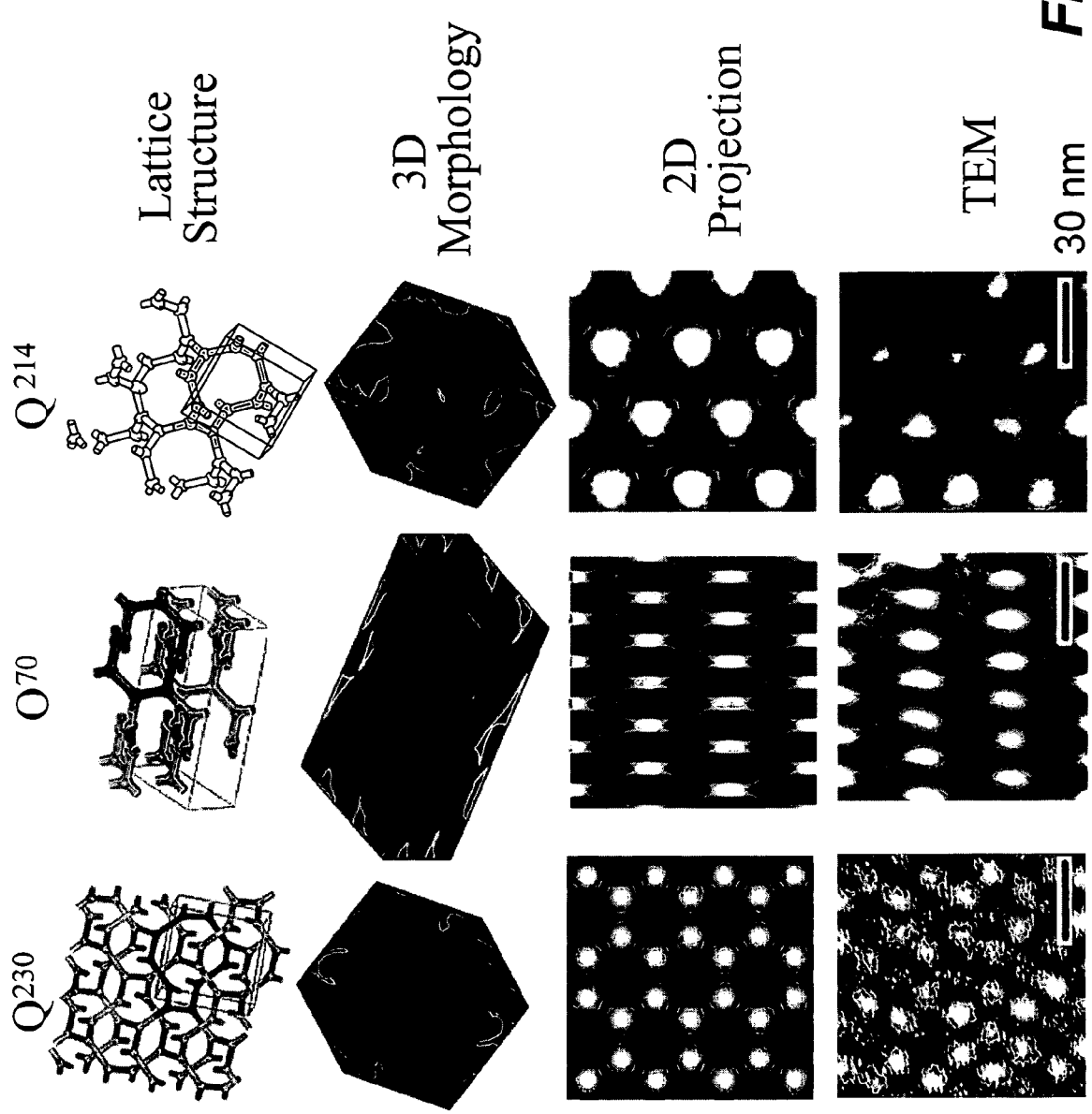

An example of structure having multiple continuous domains is shown in FIG. 4B—although not seen in the figure, which shows only a unit cell, each of the two branched domains connects with all other branches of that domain. Other examples of structures having multiple continuous domains are shown in FIG. 6B, discussed below.

As indicated above, in certain embodiments, binary surface patterns are used to drive the assembly of triblock copolymers. Three-component films having three-dimensional character are thus formed from simple patterns. For example, triblock A-b-B-b-C structure a in FIG. 3A shows a ternary lamellar morphology, alternating A-B-C lamellae. The inventors have found that a binary pattern may be used to drive the assembly of triblock copolymers if preferential surface interactions of blocks of the copolymer with the activated regions of the patterned surface result in an overall minimization of energy so that the desired morphology is formed.

The pattern required to form an n-block copolymer (where n is at least 3) is thus at least a degree less complex than the bulk morphology of the copolymer material. This is especially important for morphologies that are more complex and would otherwise require complex patterning techniques.

For example, an alternating striped binary pattern (a-b-a-b) may be used to direct assembly of block copolymers having two components that form lamellar morphology as the symmetry of the substrate pattern matches is matched to the bulk morphology of these components. Thus, structures a-d depicted in FIG. 3A may all be formed by using an alternating stripes binary pattern using the methods of the invention. In these cases, the pattern matches two components of the triblock bulk morphology, with the other component ignored, i.e., having no corresponding region on the pattern surface. The alternating stripes pattern may also be thought of as corresponding to only one of the two lamellar phases. Structures b, c, d and e may also be formed using a binary pattern with a geometry corresponding to the cylinders or spheres of these structures. In this case, the pattern matches one component of the triblock bulk morphology. Similarly, structures f-h may be formed using a binary pattern of hexagonally-arrayed spots and structures i and j may be formed using square arrays of spots.

Figure 5A:
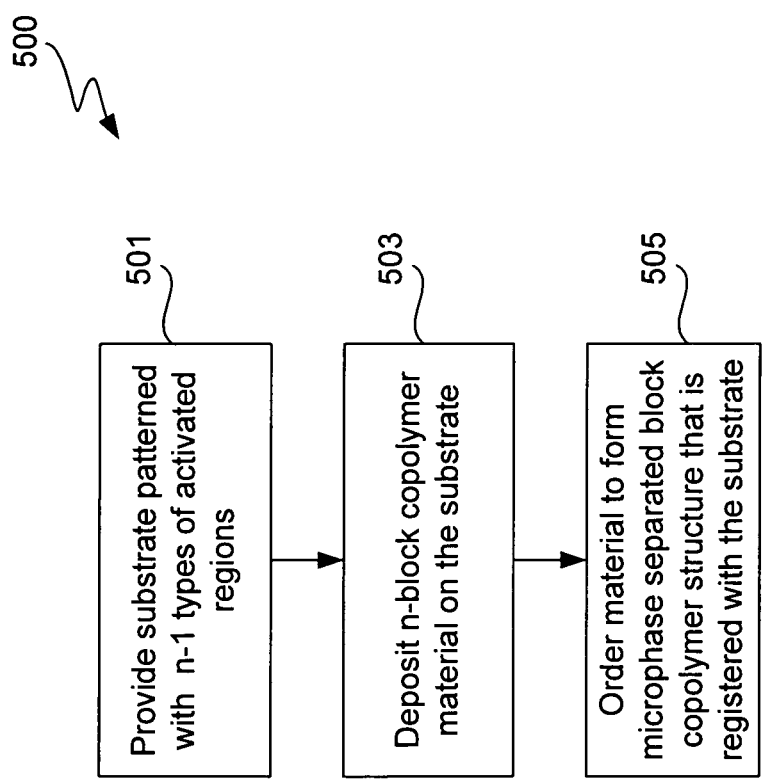
FIG. 5 shows a schematic of a method according to an embodiment of the invention. In the schematic, assembly of a copolymer structure having coaxial cylinders is shown.

FIG. 5A shows a process flowsheet illustrating basic operations of a method 500 according to an embodiment of the invention. First in an operation 501, a substrate patterned with n−1 types of activated regions is provided. An activated region is a region that is highly preferential to one or more of the components of the block copolymer material to be deposited on the substrate (i.e., so that it will be wet by those components and not by the remaining components). Various methods of patterning a substrate are discussed below. Then in an operation 503 an n-block copolymer material is deposited on the substrate. An n-block copolymer material is a material that includes an n-block copolymer (e.g., a n-block copolymer/homopolymer blend). In the method depicted in FIG. 5A, n is at least 3. Thus, for a triblock copolymer material, the substrate would have a binary pattern. In a method 505, the material is ordered to form a microphase separated block copolymer structure that is registered with the underlying substrate. This may involve, for example, annealing the block copolymer material above the glass transition temperature of the blocks of the copolymer material.

As indicated above, the preferential surface interactions of blocks of the copolymer material with activated regions result overcome unfavorable blocks/substrate surface interactions, resulting in an overall minimization of the energy so that the bulk morphology is obtained. In certain embodiments, there may be local unfavorable interactions with a block and an activated region, but the overall energy is minimized.

In certain embodiments, one component of the bulk morphology of a triblock copolymer material may wet a first type of activated region, and the other two components wet the second type of activated region of the substrate pattern. This permits directed assembly of a thin film having a morphology that matches the bulk morphology of the copolymer material.

In other embodiments, one component corresponds to a first type of activated regions, a second component corresponds to a second type of activated region and a third component may wet both the first and second types of activated regions (for example, if deposited on an alternating stripe pattern, the cylinders of structure b in FIG. 3A may span the two types of regions).

Figure 5B:
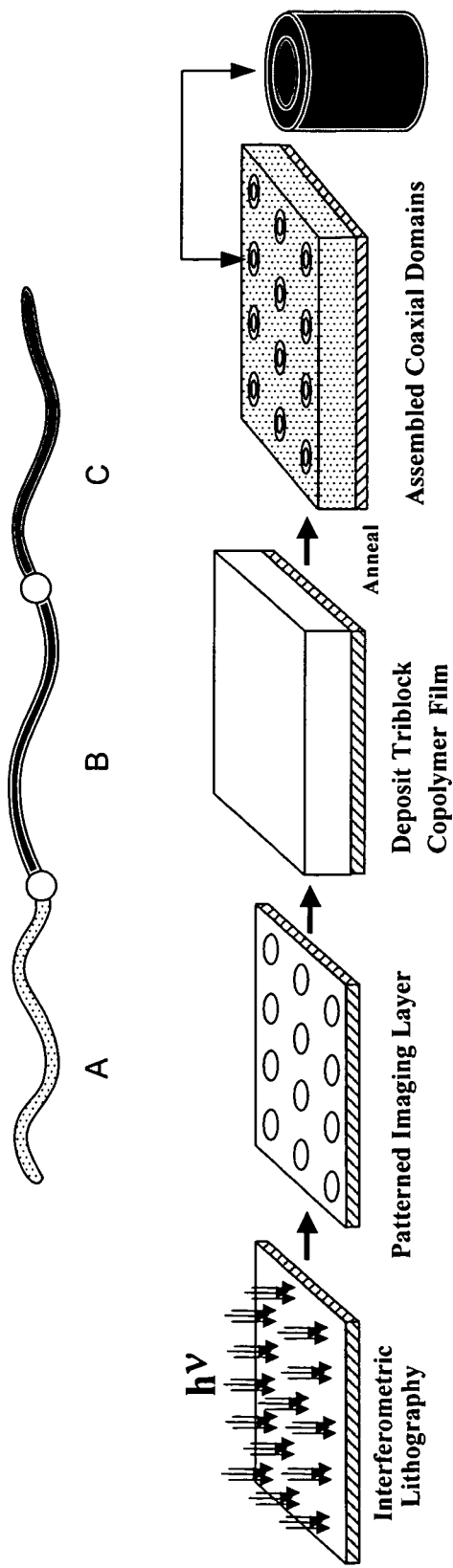

FIG. 5B illustrates a method according to an embodiment of the invention. In this embodiment, the assembly of the coaxial cylinder phase (structure f in FIG. 3A) is illustrated. Prior to the procedure depicted in the figure, a molecularly thin imaging layer is deposited on the substrate. This layer can be patterned with regions of different functionality using advanced lithographic tools, as shown in the schematic. (As discussed below, this is only an example of a variety of methods that may be used to pattern a substrate). In this embodiment, the substrate is patterned with a hexagonal array of spots. The chemistry of the hexagonal arrays of spots in FIG. 5B are tailored to be preferentially wet by phase A or the A and B components of the triblock copolymer, and the chemistry of the regions in between the spots is tailored to be preferentially wet by the B and C components or the B component of the triblock copolymer (i.e., so that the one type of activated region is preferentially wet by two components and the other by one components). Thus there are two types of activated regions on the substrate: the hexagonal array of spots is one type, and the area between the spots the other type. After the pattern is created, the triblock A-b-B-b-C copolymer material is deposited on the patterned substrate. In the bulk (at the appropriate temperature) the copolymer material self-assembles into the coaxial cylinders, as show in structure f in FIG. 3A. In the method depicted, the copolymer film is ordered, in this example by annealing, and the film self-assembles into the coaxial cylinder morphology. The surface pattern directs the coaxial cylinders to be oriented perpendicular to the substrate, to be registered with the underlying lithographically defined surface pattern, and to form perfectly ordered addressable arrays. Thus the simple binary two-dimensional surface pattern is transformed into a three-component and three-dimensional structure throughout the thickness of the overlying copolymer film.

Other structures that may be formed on surfaces patterned with hexagonal arrays of spots include those depicted in FIG. 3B. Structures that may be formed on surfaces patterned with on patterns of alternating (a-b-a-b) stripes include those depicted in FIG. 3A.

In the directed assembly of all the decorated ABC phases, the chemically patterned substrate allows: 1) the desired orientation of the structures with respect to the substrate, 2) perfect patterning over arbitrarily large areas, and 3) registration of the structures with the substrate.

Structures that may be grown are not limited to the decorated phases depicted in FIGS. 3A, 3B and 4A but may be any morphology obtainable in the bulk. The methods of the present invention are not limited to directed self-assembly of triblock copolymers but also include directed assembly of block copolymers having higher numbers of components. For example, multiblock copolymers described as in Masuda et al Physical Review Letters 97, 09830 (September 2006), may be directed to assemble on substrates in accordance with the methods described herein.

In certain embodiments, an n-block copolymer material is deposited on a substrate having from 2 to n−1 different chemistries or types of activated regions. For example, in one embodiment, a four-component block copolymer A-B-C-D may be deposited on a substrate having a ternary (three types of activated regions) pattern. In certain embodiments, directed assembly of the A-B-C-D block copolymer may be accomplished using a binary pattern.

According to certain embodiments, multiply continuous phases are formed. An example of a multiply continuous phase structure is shown in FIG. 4B. Other examples of triply continuous phases are shown in Bailey, T. S., et al., *A noncubic triplperiodic network morphology in poly(isoprene-b-styrene-b-ethylene oxide) triblock copolymers*. Macromolecules, 2002. 35(18): p. 7007-7017. Bates, F. S., *Network phases in block copolymer melts*. Mrs Bulletin, 2005. 30(7): p. 525-532. Epps, T. H., et al., *Ordered network phases in linear poly(isoprene-b-styrene-b-ethylene oxide) triblock copolymers*. Macromolecules, 2004. 37(22): p. 8325-8341. Epps, T. H., et al., *Network phases in ABC triblock copolymers*. Macromolecules, 2004. 37(19): p. 7085-7088; which are hereby incorporated by reference for all purposes. As with the directed assembly of the decorated phases, the chemically patterned substrate allows: 1) the desired orientation of the structures with respect to the substrate, 2) perfect patterning over arbitrarily large areas, and 3) registration of the structures with the substrate.

Continuous morphologies can be represented by unit cells; each face of the unit cells exposing a specific geometric pattern of the phases of multi-phase block copolymer. An example of a unit cell of a triblock A-B-C copolymer, specifically the $Q^{214}$ network phase is given in FIG. 6A, along with along with a rough schematic of the 2-D projection of one of the faces of the unit cell. (As shown in FIG. 6B, the actual 2-D projection and TEM image of the copolymer show that the spots are a generally triangular shape).

Using chemically nanopatterned surfaces with geometries, dimensions and chemical functionality that are commensurate with a face of a unit cell of a triply continuous phase, the assembly of films of network-forming copolymers dictated by the face of the unit cell that is directed to be in contact with the substrate may be formed. For example, examination of the $Q^{214}$ lattice structure and the two-dimensional projection of one face of the unit cells in FIG. 6A, shows that it could be directed to assemble on a chemically nanopatterned surface having a pattern of spots in hexagonal arrays. Examples of other triply continuous networks that could be directed to assemble by these methods include the $O^{70}$ and $Q^{230}$ phases. FIG. 6B shows lattice structures (with unit cells) of the $Q^{214}$, $O^{70}$ and $Q^{230}$ network phases; 2-D projections of one face of the unit cells; and TEM images. A hexagonal array of spots may also be used to direct assembly of the $Q^{230}$ network phase, while the $O^{70}$ network phase requires a more specialized surface pattern. For example, to drive assembly of the $O^{70}$ phase, a binary pattern having one type of activated region in the locations of the bright spots of the 2-D projection and the other type of activated region in the locations of the black and grey areas of the 2-D projection, could be used. The binary pattern would thus be spots in a field. Similarly, a binary pattern having one type of activated region in the locations of the black spots of the 2-D projection and the other type of activated region in the locations of the bright and grey areas of the 2-D projection, etc. could be used.

In certain embodiments, to drive assembly of a triblock copolymer using a binary pattern, a binary pattern having a first activated region (e.g., wetting chemistry) that follows one component of the 2-D projection of bulk morphology and a second activated region that follows the other two components of the 2-D projection is used. It should be noted that any 'slice' of the unit cell may be used to obtain the desired orientation of the assembled copolymer structure on the substrate.

As discussed above with reference to the decorated phases, in certain embodiments, the first and second types of activated regions of a binary pattern may respectively correspond to or be preferentially wet by first and second components of the block copolymer (e.g., lamellar phases of structure b of FIG. 3A deposited on an alternating stripes pattern), while the third component wets both types of activated regions. In that case, the first component preferentially wets the first type of activated region, the second component preferentially wets the second type of activated region and the third component wets both types of activated regions.

In certain embodiments, the substrate patterns used to form continuous morphologies have from 2 to n−1 different types of activated regions, corresponding to 2 to n−1 components as of the block copolymer material, as discussed above. Also, in other embodiments, the substrate may be patterned with n activated regions.

According to various embodiments the multiply continuous films may be characterized by one or more of the following 1) each phase is addressable at the substrate and the surface of the film, 2) the morphology is perfectly organized or ordered over arbitrarily large areas and throughout films as thick as about 0.5 to 1 micron, and 3) the network morphology is oriented is space with precision, dictated by the face of the unit cell that is directed to be in contact with the substrate.

Applications

Applications of the films described above include enhancing the lithographic process through the introduction of information rich materials such that multiple device layers or multiple device materials can be patterned in one lithographic exposure step. In certain embodiments, simple patterns in the aerial image of an exposure tool (lines or spots) can be facilely transformed via directed assembly into complex architectures and reducing the cost of manufacturing at the nanoscale.

For example, in one embodiment, the morphology depicted in structure d in FIG. 3A is used to pattern contact holes together with interconnects. Likewise, simple-to-create patterns of lines or spots are transformed into rich three-dimensional structures due to the self-assembling nature of the triblock copolymer films. For all types of morphologies, the essential properties of device fabrication may be retained: the lithographic or other patterning step assures that the assemblies are defect free (in fact the self-assembly nature of the copolymer materials would heal some of the lithography errors or noise) and precisely registered for interconnects or other input/output strategies.

Further applications include additive and subtractive templating processes to transfer the domain structure of the polymer films into patterns of metals, semiconductors, and dielectrics. For example, poly(isoprene) and can be selectively removed from the three dimensional structures by exposure to ozone to create soft masks for etching, or the voids can be backfilled by electrodeposition of metals. Polyethylene oxide domains can be selectively infused with metal alkoxides in supercritical carbon dioxide, and condensation reactions result in patterned metal oxide or silicate domains. Poly(ethylene oxide)/poly(acrylic acid) blend domains may be used as nanoreactors for synthesizing nanoclusters and nanoparticles synthesized in-situ. Poly(styrene) is often used as the structural support material for the nanostructures.

Figure 7A:
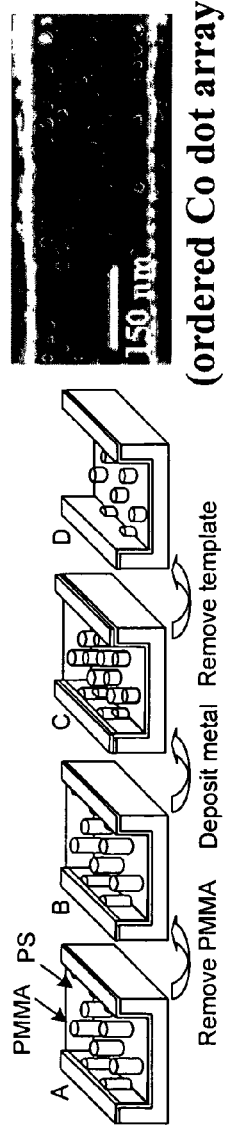
FIGS. 7A-C show examples of selected applications of registered thin film block copolymer structures.
Figure 7B:
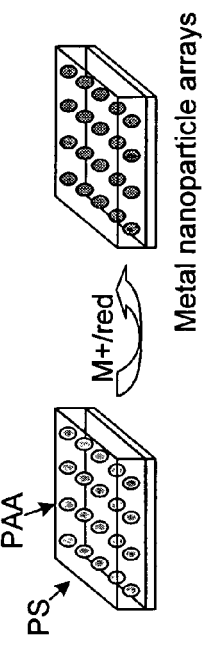
Figure 7C:
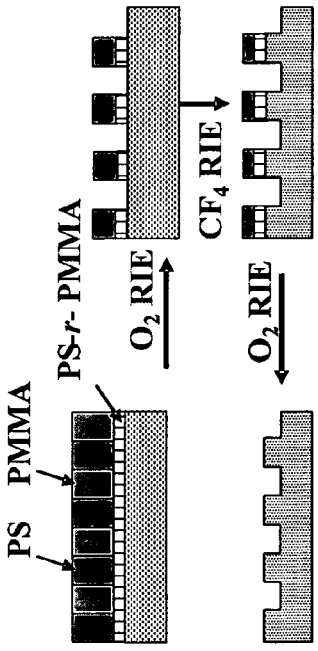

FIGS. 7A-C shows examples of selected pattern transfer applications (although these figures depict the use of diblock copolymers, triblock copolymers may be used to introduce additional complexity). In FIG. 7A, an example of using a block copolymer structure as a template for selective metal deposition is depicted. Directed assembly is used to form PS cylinders in a PMMA matrix (A) and PMMA is then removed (B). After removal of the PMMA, metal is selectively deposited at the cylinder locations (C). The template is then removed (D). An example of an ordered Co dot array that may formed by such a method is shown. FIG. 7B shows an example of a nanoreactor for in-situ nanoparticle synthesis. Spherical PS-b-PAA is formed by directed assembly, followed by selective incorporation of metal salt into the PAA domain, and subsequent reduction. An example of ordered Au nanoparticles formed by such a method is shown. Nanoparticle and nanocluster arrays of materials including Au, Ag, Co. Ob, Pt and $Fe_2O_3$ may be formed by similar methods. FIG. 7C shows an example of using block copolymer structures as a soft mask for reactive ion etching. The desired pattern is transferred to the underlying substrate by successive reactive ion etching processes. An example of an etch Si structure that may be formed by such a method is shown. Other applications include forming functional features in the block copolymer material, for example, nanoscale conductive lines.

Examples of post-processing of copolymer structures and their applications are given below. (Although many of the below examples refer to diblock copolymers, one of skill in the art will understand how to selectively remove, functionalize, etc. domains of triblock and higher order copolymers.)

| Block copolymers (m)[a] | Methods | Patterned materials |
|---|---|---|
| 1. Block copolymer films as etch masks: Remove one block and etch | | |
| PS-b-PI (s) | selective ozonization of P1 or PB, and pattern transfer by RIE | silicon nitride nano holes and nano dots |
| PS-b-PB (s) | | |
| PS-b-PMMA (c) | selective removal of PMMA by UV/acid, and pattern transfer by RIE | nanoporous dielectric films, nano-textured silicon, MOS capacitor |
| PS-b-PFP (s) | selective etching of PS and pattern transfer to underlying metal layers | high-density magnetic storage meadia: Co nanodot arrays |
| 2. Templates for selective metal deposition: Remove one block and deposit metals | | |
| PS-b-PMMA (c) | selective removal of PMMA, and dc electrodeposition of metals | vertical arrays of high-density Co nanowires |
| PS-b-PI (s) | removal of PI or PMMA, and subsequent metal deposition/lift-off | dense GaAs (quantum dot) arrays |
| PS-b-PMMA | | Cr, layered An/Cr, Co dot arrays |
| 3. Nanoreactors for producing nanoparticle nanocluster arrays | | |
| MTD-b-NORCOOH (s,c,l) | selective incorporation of metal salts into COOH-functionalized domain or P4VP domain, and subsequent reduction | Au, Ag, Co, Pb, Pt, $Fe_2O_3$ nanocluster and nanoparticle arrays |
| PS-b-PAA (s) | | |
| PS-b-P4VP (l) | | |
| 4. Templates for metal alkoxide infusion and condensation | | |
| PE-b-PEO (s) | infusion of M(OR)x and selective condensation within the PEO block, followed by calcination | mesoporous silicates or metal oxide films: ultralow-dielectric constant films |
| PEO-b-PPO-b-PEO (s,c) | | |

[a]morphologies of block copolymer thin films; (s: spheres, c: cylinders, l: lamellae)

It should be noted that using triblock copolymers allows for encoding substantially more information in the photoresist than is possible with diblock copolymers, and allows patterning and manufacturing in three dimensions. Whereas diblock copolymers have been limited (in practice) to morphologies of spheres, cylinders, and lamellae, ABC triblock copolymers provide access to a plethora of three-phase morphologies with discrete and multiple continuous domains. Furthermore, the persistence length of the ordered ABC triblock morphologies may allow templating of three-dimensional nanostructures throughout polymer films that are much thicker (500-1000 nm) than the thin films (<50 nm) of diblock copolymers typically used for applications in lithography.

Applications of triblock copolymers include the fabrication of sub-lithographic features, three-component assembly from a binary pattern, patterning of hard-to-pattern structure (e.g., interconnect) designs from simple patterns such as lines and the fabrication of two device layers from one lithographic step. As discussed further below in the Examples, sub-lithographic features may be fabricated in certain embodiments of the present invention by a patterning at the dimension required for two blocks (e.g., for coaxial cylinders having diameters of 50 nm and 80 nm, patterning at 80 nm), and then selectively removing/functionalizing block so that the smaller (e.g., 50 nm cylinder) block is used to create the desired feature.

Applications of the films and methods of the present invention are not limited to semiconductor processing, but include biological applications, preparation of membranes for separations or as catalyst supports, nanoscale filtering, etc. The substrate may be dictated by the particular application, for example appropriate substrates for biological applications may be biologically compatible. The ability to deposit the films and achieve good ordering at films of thickness in the hundreds of nanometers to angstroms makes these films particularly suitable for certain applications (e.g., using a multiply continuous structure for filtering, etc.)

Substrate

Any type of substrate may be used. In semiconductor applications, wherein the block copolymer film is to be used as a resist mask for further processing, substrates such as silicon or gallium arsenide may be used. According to various embodiments, the substrate may be provided with an imaging layer thereon. The imaging layer may comprise any type of material that can be patterned or selectively activated. In a preferred embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane. (See also Peters, R. D., Yang, X. M., Kim, T. K., Sohn, B. H., Nealey, P. F., Using Self-Assembled Monolayers Exposed to X-rays to Control the Wetting Behavior of Thin Films of Block Copolymers, Langmuir, 2000, 16, 4625-4631; Kim, T. K., Sohn, B. H., Yang, X. M., Peters, R. D., Nealey, P. F., Chemical Modification of Self-Assembled Monolayers by Exposure to Soft X-rays in Air, Journal of Physical Chemistry B, 2000, 104, 7403-7410. Peters, R. D., Yang, X. M., Nealey, P. F, Wetting behavior of block copolymers self-assembled films of alkylchlorosilanes: Effect of grafting density, Langmuir, 2000, 16, p. 9620-9626., each of which is hereby incorporated by reference in its entirety and for all purposes.)

In certain embodiments, the imaging layer comprises a polymer brush. The polymer brush may comprise homopolymers or copolymers of the monomers that comprise the block copolymer material. For example, a polymer brush comprised of at least one of styrene and methyl methylacrylate may be used where the block copolymer material is PS-b-PMMA. An example of a polymer brush is PSOH.

Patterning the Substrate

Substrate patterning generally involves configuring certain regions of the substrate to interact in a highly preferential manner with at least one of the components in the copolymer material. The preferential interaction may be based on any property of the substrate pattern material and/or the copolymer material. In some embodiments, a region of the substrate pattern interacts with a component of the copolymer film due to the interfacial energy between them. For example, if the block copolymer material is a PISO block copolymer, the substrate pattern may be configured so that a region of the pattern is highly preferential to one or two of PI, PEO or PS. This may be done by tailoring the composition of the substrate pattern.

The substrate may be patterned by any method including chemical, topographical, optical, electrical, mechanical patterning and all other methods of selectively activating the substrate. In embodiments where the substrate is provided with an imaging layer, patterning the substrate may comprise patterning the imaging layer. A substrate may be also patterned by selectively applying the pattern material to the substrate. The substrate patterning may comprise top-down patterning (e.g. lithography), bottom-up assembly (e.g. block copolymer self-assembly), or a combination of top-down and bottom-up techniques.

In an example of one procedure that may be used to pattern a substrate, a PS brush is grafted to a substrate. A thin film of photoresist is then deposited on the PS brush. The photoresist is patterned by extreme ultraviolet (EUV) interference lithography to achieve the desired pattern. The substrate is then treated with an oxygen plasma to modify the PS regions not covered with photoresist to be oxygen-rich and highly polar. Removal of the remaining photoresist then results in the desired chemically patterned substrate. PMMA preferentially wets the spots and PS the region surrounding the spots. Block copolymer material may then be deposited on the patterned substrate to form the films of the invention. In particular embodiments, the substrate is patterned with x-ray lithography, extreme ultraviolet (EUV) lithography or electron beam lithography.

As indicated, the substrate patterning may comprise top-down patterning (e.g. lithography), bottom-up assembly (e.g. block copolymer self-assembly), or a combination of top-down and bottom-up techniques. In another example, a process for directed self-assembly may be used in conjunction with lithography to create sub-lithographic resolution patterns. In one technique, lithography may be used to activate desired regions on the substrate thereby defining gross features. A block copolymer material is then deposited on the activated regions and phase segregation is induced to direct self-assembly of the copolymer into domains. One block of the copolymer may then be selectively removed. The exposed regions of the substrate would then be selectively activated, thereby creating the pattern on the substrate.

As discussed above with respect to FIG. 5B, in certain embodiments, the binary patterns have two types of activated regions—one which is wetted by (or otherwise preferential to) two of the blocks of the triblock copolymer, and the other which is wetted only by the remaining block of the triblock copolymer. An example, as indicated above, is using a PS brush and oxygenated PS brush to drive the assembly of PISO triblock copolymers with the PI and PS wetting the PS brush and the PEO wetting the oxygenated PS brush.

In other embodiments, binary patterns have two types of activated regions—one that is wetted by first and third blocks of a triblock (and not the second) and the other that is wetted by second and third blocks of the triblock copolymer (and not the first). Energetically, the interaction between the third block and the different types of activated regions may be equal (i.e., the third block may not be preferential to either type of activated region), or if there is a non-favorable interaction, it is overcome by the overall preferential surface interactions between the block copolymer and the activated regions.

Preferential interactions between the activated region and the block copolymer depend on the specific composition of the imaging layer (or other substrate chemistry). In certain embodiments, patterning the substrate may involve using a polymer brush made out of one or more components of the triblock. The wetting behavior of block copolymer thin films depends upon the interfacial energy between each block of the copolymer and the substrate, with the block having the lower interfacial energy preferentially wetting the substrate. In certain embodiments, the composition of the polymer brush is tailored to be preferentially wet by one or two components of the triblock. Also, in certain embodiments, patterning the substrate may involve treating areas of the polymer brush to be preferentially wet by one or more components (e.g., oxygenating a PS brush). In certain embodiments, random polymer brushes that are neutral to one or more components of the triblock may be used (See, e.g., *Side-chain-grafted random copolymer brushes as neutral surfaces for controlling the orientation of block copolymer microdomains in thin films*, Langmuir 22 (18): 7855-7860 2006), hereby incorporated by reference in its entirety and for all purposes).

Chemically patterned surfaces may have a transition chemistry between adjacent types of activated regions over certain length scales. Thus, in certain embodiments, binary patterns have two types of activated regions and a transition region between adjacent differently-typed regions. Similarly ternary and more complex patterns may have transition regions between adjacent differently typed activated regions. These transition regions may or may not be beneficial to driving the assembly of the block copolymer films.

Pattern

As discussed above, the pattern should be matched in symmetry and/or length scale to at least some components of the bulk morphology of the copolymer material in order to direct assembly. In certain embodiments, the pattern matches two components of the block copolymer morphology (or from 2 to n−1 components).

In some embodiments, matching the pattern is not limited to exact duplication of the components of the bulk morphology. For example, as discussed above, the structures shown in FIG. 3A may be formed using an alternating stripe pattern. The length scale of the lamellar components of structure b, for example, may be considered the width of two stripes. Similarly, the substrate length scale of $L_s$ of an alternating stripes pattern may be considered the distance between alternate interfaces on the pattern (i.e. the width of two stripes). (For cylindrical and spherical domain structures, the length scale of the bulk domain structures can be characterized by the distance between the cylinders or spheres in the hexagonal array, for example.) In some embodiments the pattern length scale $L_S$ may be considered "matched" to the bulk morphology $L_o$ even if $L_o \neq L_S$ as long as $L_o$ and $L_S$ are close enough that good ordering is achieved. (See, e.g., US Patent Publication No. 2006-0134556, hereby incorporated by reference, for all purposes). Similarly, an alternating stripe pattern that skips stripes (a-a-b-a-a-b-a-a) is considered to be matched to the morphology depicted in structure b as long as the substrate pattern is commensurate enough with the bulk morphology to direct assembly of the bulk morphology at the surface. In certain embodiments, the substrate pattern matches the 2-D projection of one or more components of the n-block copolymer. This is discussed above with reference to FIG. 6B.

Block Copolymer Material

The block copolymer material comprises a block copolymer that may be comprised of any number of distinct block polymers (i.e. diblock copolymers, triblock copolymers, etc.).

The block copolymer material may further comprise one or more additional block copolymers. In some embodiments, the material may be a block copolymer/block copolymer blend.

The block copolymer material may also further comprise one or more homopolymers. In some embodiments, the material may be a block copolymer/homopolymer blend.

The block copolymer material may comprise any swellable material. Examples of swellable materials include volatile and non-volatile solvents, plasticizers and supercritical fluids.

In certain embodiments, triblock copolymers comprising blocks of polyisoprene, polystyrene, and poly(ethyleneoxide) are used. These triblock copolymers form decorated and network phases (see Epps, T. H., et al., *Network phases in ABC triblock copolymers*. Macromolecules, 2004. 37(19): 7085-7088, hereby incorporated by reference) and comprise polar and non-polar blocks that are amenable for directed assembly using chemically patterned polar and non-polar surfaces.

ABC triblock and related multiblock copolymers may be synthesized by any known method, including anionic polymerization. This technique affords quantitative control over the molecular composition and overall molecular weight while maintaining a relatively narrow polydispersity index ($M_w/M_n < 1.15$).

EXAMPLES

The following examples provide details illustrating aspects of the present invention. These examples are provided to exemplify and more clearly illustrate these aspects of the invention and are in no way intended to be limiting.

Example 1

A representative example polymerization of poly(isoprene-b-styrene-b-ethylene oxide) (PI-PS-PEO) or PISO for shorthand, is conducted with the following steps. All monomers are purified by destructive distillation while the polymerization solvents are passed over activated silica columns and all reagents are isolated from air and other contaminants. A specified amount of sec-butyllithium is added to cyclohexane followed by isoprene with subsequent polymerization for roughly four hours at 40° C. Addition of styrene along with a small amount of tetrahydrofuran (THF) leads to the rapid crossover from isoprenyllithium to styryllithium and chain growth, again at 40° C. After approximately four hours the reaction is terminated with a ten-fold excess of ethylene oxide followed by addition of HCl in methanol, which terminates each chain with an alcohol group. The PI-PS-OH product is recovered by extraction, precipitation, and washing, then redissolved in THF and reinitiated with potassium naphthenelide. This procedure is facilitated by titration of impurities with the intensely green initiator; complete initiation is signaled by a persistent faint green color. Addition of a metered amount of ethylene oxide and chain polymerization followed by termination with acid completes the triblock preparation. The product is isolated by precipitation and drying, and characterized by NMR, size exclusion chromatography (SEC), and light scattering.

Example 2

A triblock copolymer (PEO-PI-PS) that forms three-phase lamellar structures (see structure a in FIG. 3A) was directed to assemble on chemically nanopatterned surfaces having alternating stripes of polar and non-polar functionality. The PEO preferentially wets the polar stripes on the surface, and the PI and PS preferentially wet the non-polar stripes of the surface.

FIG. 8A shows a schematic representation of the procedure used to create the nanopatterned substrates and FIGS. 8B and 8C show results. First, in FIG. 8A, a representation of the PEO-PI-PS block copolymer is shown, with the PI represented by a dotted pattern, PS a lighter grey solid and PEO a darker grey solid. The binary patterned imaging layer is shown, with the differently striped areas illustrating the patterning. The PEO-PI-PS block copolymer material is then deposited on the binary pattern and direct to self-assemble on the pattern. The result is three-phase lamellar morphology formed by the triblock copolymer as shown.

The triblock copolymer material was deposited on patterned and unpatterned regions. FIG. 8B shows an SEM micrograph of the macroscopic area on which the copolymer material was deposited, including patterned and unpatterned regions. As deposited on an unpatterned region, the SEM micrograph shows large blobs—areas where the block copolymer has assumed a morphology undirected by the substrate pattern. In contrast, the copolymer material on the pattern region is ordered. (The squares in the patterned regions are artifices from the SEC micrograph process). As can be seen from comparing the patterned and unpatterned regions in FIG. 8B, the block copolymer film displays good order on the patterned regions. FIG. 8C is a magnified view of a patterned region shown in FIG. 8B, also showing good order. The data indicates that the lamellae are oriented perpendicular to the substrate, the assembly is defect free over the areas that are chemically patterned, and the three-phase lamellae are perfectly registered with the underlying surface pattern.

Example 2A

A binary striped binary pattern was created on a substrate by depositing a PS brush on the substrate and a photoresist layer on the brush. The photoresist was patterned by EUV interference lithography to create lines 25 nm apart. The photoresist pattern was replicated to the PS brush by exposure to an oxygen plasma. Excess photoresist was then removed using solvent rinses to result in a layer patterned with alternating stripes of a PS brush and an oxygenated PS brush. The pattern period (width of two adjacent stripes) was 50 nm.

A triblock PISO copolymer (I=33.4%; S=34.2%; O=32.4% by volume; Phase: $Lam_3$; $L_0$=50.9 nm) was deposited on the binary patterned substrate. The PS brush was wet by PS and PI and the oxygenated PS brush by PEO.

Figure 8D:
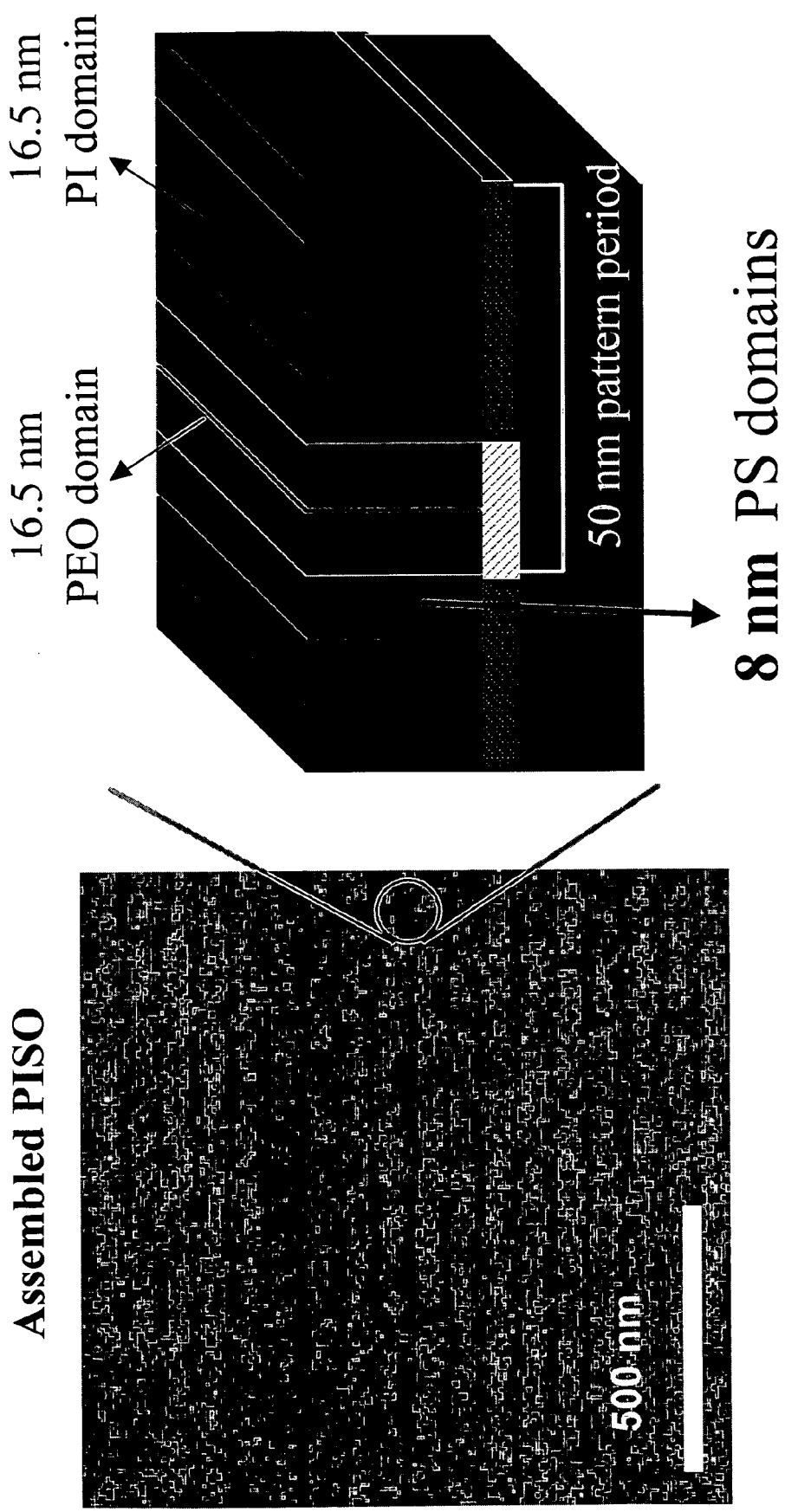
FIG. 8D is an SEM image of lamellar domains of an assembled PISO triblock copolymer structure. A schematic of the assembled structure showing domain and pattern dimensions is also shown.

FIG. 8D shows an image of the assembled PISO. FIG. 8D also shows a schematic of the assembled PISO and its dimensions that is consistent with image and believed to be the resulting structure. As can been seen from the schematic, the PEO and PI domains are 16.5 nm each, and the PS domain is 8 nm. Removing the PS domain would result in 8 nm features—a sub-lithographic pattern dimension. The period of the PS domain is also 25 nm (a result of the (PI-PS-PEO)-(PEO-PS-PI)-(PI-PS-PEO) arrangement). Thus, from 8 nm features with a period of 25 nm are obtained from lithographically patterning 25 nm with a 50 nm period.

Example 3

Figure 9B:
FIG. 9B is a schematic of the top view of an assembled triblock copolymer that may be used to fabricate the structure shown in FIG. 9A.
Figure 9A:
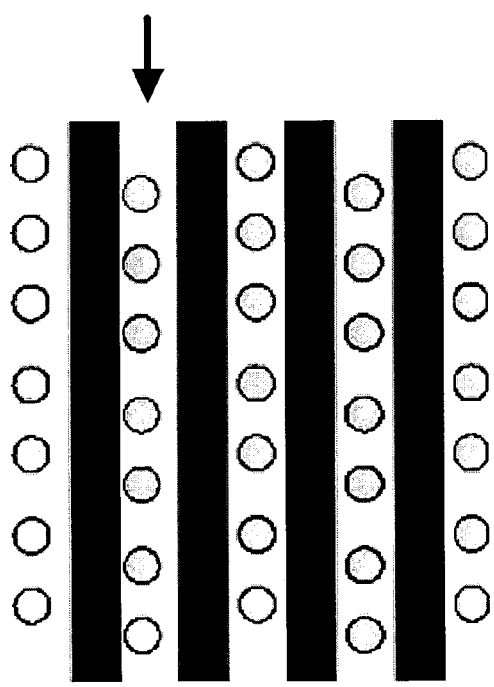
FIG. 9A is a schematic of the top view of an example of a desired metal contact structure having cylindrical metal contacts and lines of a semiconductor material that may be formed by embodiments of the present invention.
Figure 9C:
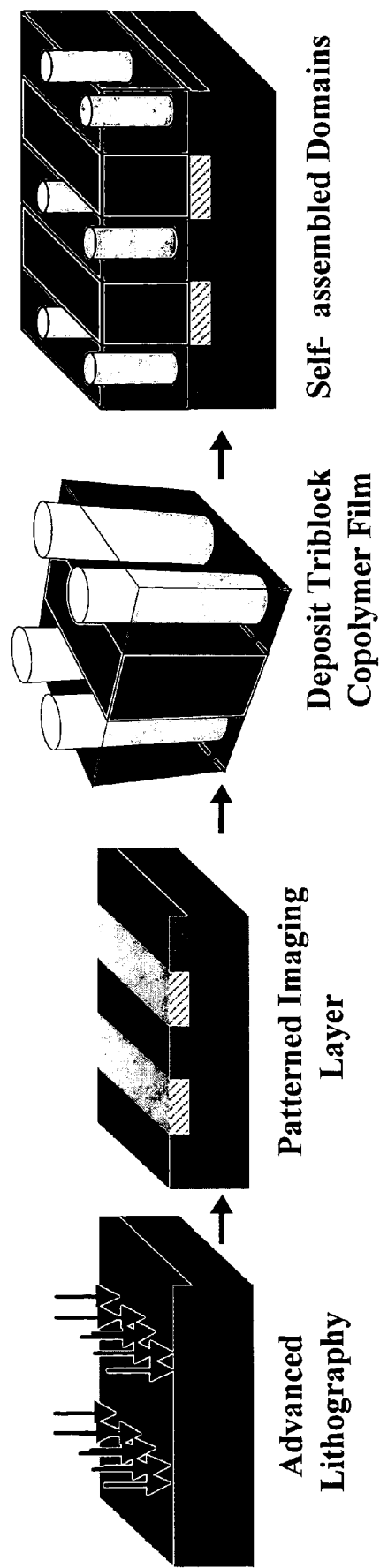
FIG. 9C shows a schematic representation of a procedure used to create nanopatterned substrates and direct the assembly of the triblock copolymer shown in FIG. 9B on a substrate according to a method of the present invention.
Figure 9D:
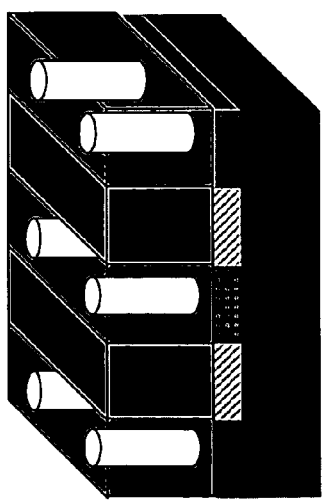
FIG. 9D shows a schematic representation of a procedure used to fabricate a metal contact structure as depicted in FIG. 9A from the assembled triblock copolymer depicted in FIG. 9C.
Figure 9D:
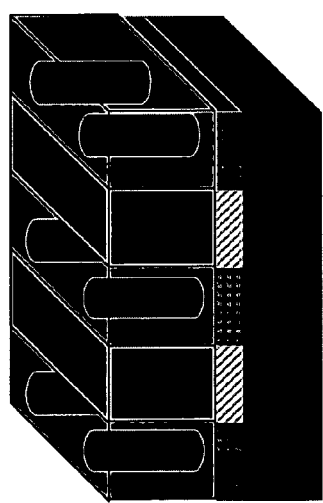
Figure 9D:
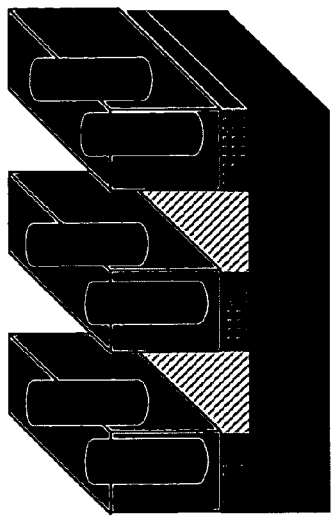
Figure 9D:
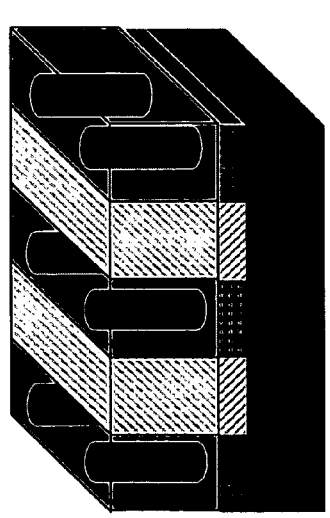
Figure 9D:
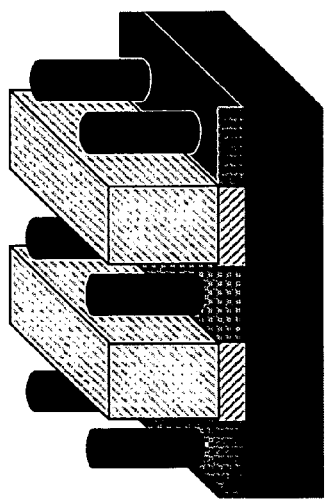

The methods described above may be used to pattern structures having multiple geometries, e.g., to pattern two device layers at once. FIG. 9A shows an example of a desired pattern and FIG. 9B the corresponding triblock copolymer (see also structure b in FIG. 3A). FIG. 9C shows the process for directed assembly to build the desired structure: lithography is used to create a binary pattern on the substrate, and the copolymer material is deposited and order to form self-assembled domains. FIG. 9D then shows a process by which the triblock copolymer structure may be processed to create a complex structure. First, the cylinder block is removed, leaving cylindrical holes. Then metal connects are deposited in the holes, creating the cylindrical metal connects desired. The lamellar domains between those with metal connects are removed. Semiconductor material is then deposited. Finally, the domain surrounding the metal cylinders is removed, leaving the desired structure. In this manner, simple binary patterns are used to pattern structures having multiple geometries.

Example 4

Figure 10A:
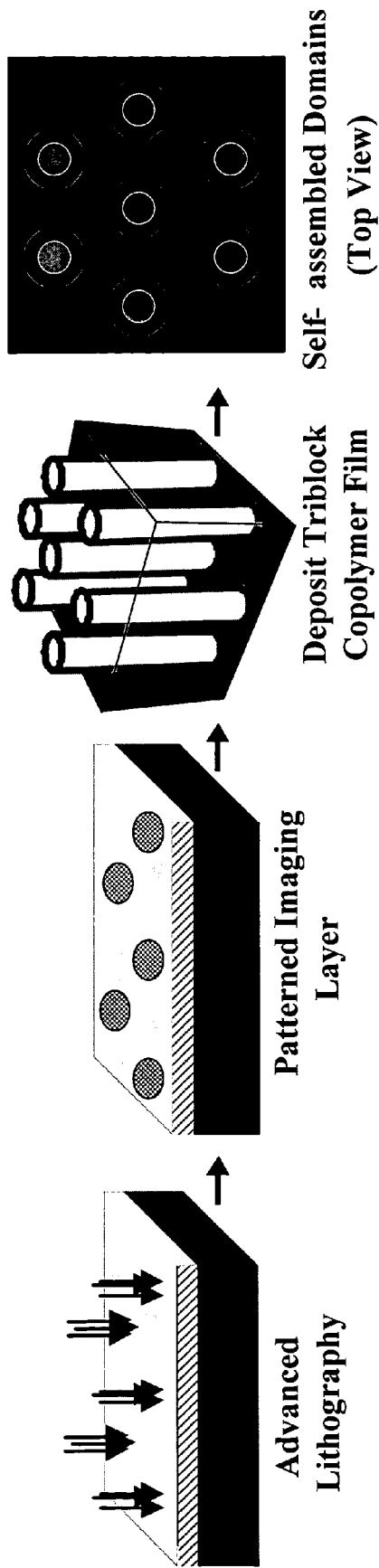
FIG. 10A shows a schematic representation of a procedure used to direct assembly of a triblock copolymer that may be used to fabricate sub-lithographic features.

FIG. 10A shows an example of patterning sub-lithographic contacts using directed assembly of triblock copolymers. First, the substrate is patterned using lithographic techniques. In this example, the pattern is a binary pattern of 80 nm diameter hexagonally arrayed cylinders. The corresponding triblock copolymer film (structure f from FIG. 3B) is deposited on the pattern. The self-assembled domains are then shown, with coaxial cylinder domains in a matrix of the third block. Directed self-assembly of the triblock copolymer material is achievable because the hexagonal spots are wet by the cylinder-forming phases and the contiguous pattern is wet by the other block.

Figure 10C:
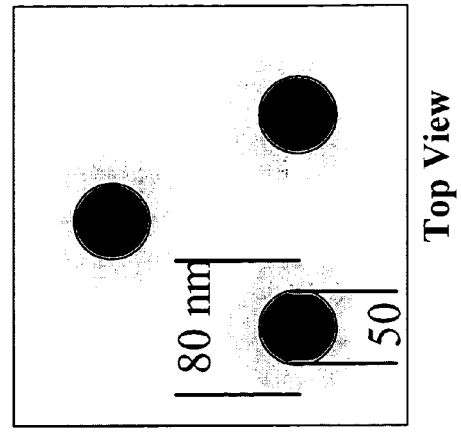
FIGS. 10B and 10C show schematic representations of sub-lithographic features that may be fabricated from the assembled triblock copolymer shown in FIG. 10A.
Figure 10B:
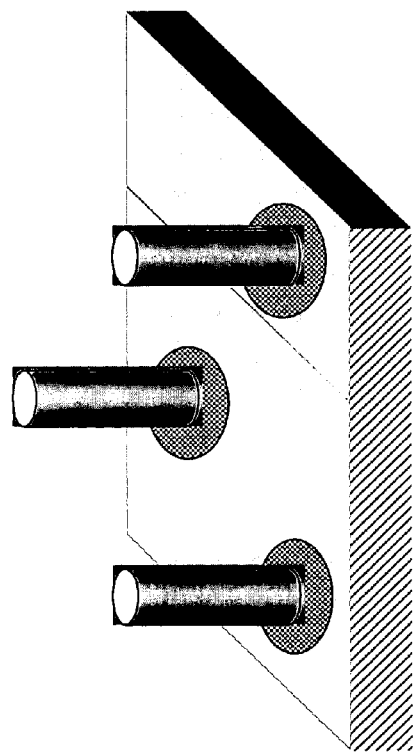

FIGS. 10B and 10C illustrate how the copolymer material may be used to create a pattern with sub-lithographic features. Metal is deposited into the inner cylinders, and the other phases are removed (the outer cylinder and the matrix). This is shown in FIG. 10B with a top view shown in FIG. 10C. As can be seen in FIG. 10C, the resulting metal contacts are 50 nm in diameter (the dimension of the inner cylinder domain)—while the lithography required to pattern the substrate is 80 nm.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

All references cited are incorporated herein by reference in their entirety and for all purposes.

The invention claimed is:
1. A thin film composition comprising
   (a) a patterned substrate comprising patterned features defined by no more than n−1 different chemical functionalities, n being at least three; and
   (b) a microphase-separated block copolymer layer comprising an n-block copolymer, and having n distinct phases overlying the patterned substrate; wherein each of the n distinct phases, either alone or in combination with another phase, is aligned with features of the underlying pattern such that a plane substantially perpendicular to the substrate and passing through a boundary between contacting features of the underlying pattern passes through a boundary between contacting phases of the microphase-separated block copolymer layer.
2. The thin film composition of claim 1 wherein the morphology of the block copolymer material is the morphology it exhibits in the bulk.
3. The thin film composition of claim 1 wherein the film morphology comprises discrete ordered elements.
4. The thin film composition of claim 1 wherein the substrate pattern corresponds to a 2-D cross-section of at least one phase of the bulk morphology of the n-block copolymer.
5. A thin film composition comprising:
   a) a lithographically patterned substrate;
   b) a microphase-separated block copolymer layer and having n distinct phases overlying the lithographically patterned substrate; wherein each of the n distinct phases, either alone or in combination with another phase, is aligned with features of the underlying pattern such that a plane substantially perpendicular to the substrate and passing through a boundary between contacting features of the underlying pattern passes through a boundary between contacting phases of the microphase-separated block copolymer layer, and wherein at least one phase of the microphase-separated block copolymer layer has a dimension less than the smallest dimension of the lithographic substrate pattern.

6. The thin film composition of claim 5 wherein the morphology of the block copolymer is the morphology it exhibits in the bulk.

7. The thin film composition of claim 5 wherein the film morphology comprises discrete ordered elements.

8. The thin film composition of claim 5 wherein film comprises cylindrical features.

9. The thin film composition of claim 5 wherein film comprises lamellae.

10. The thin film composition of claim 5 wherein film comprises spheres.

\* \* \* \* \*